(12) United States Patent
Ariyoshi et al.

(10) Patent No.: US 6,830,978 B2
(45) Date of Patent: Dec. 14, 2004

(54) SEMICONDUCTOR DEVICE AND MANUFACTURING METHOD FOR THE SAME

(75) Inventors: Junichi Ariyoshi, San Jose, CA (US); Satoshi Torii, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/643,970

(22) Filed: Aug. 20, 2003

(65) Prior Publication Data

US 2004/0155297 A1 Aug. 12, 2004

(30) Foreign Application Priority Data

Aug. 21, 2002 (JP) ........................................ 2002-240540

(51) Int. Cl.$^7$ ............................................ H01I 21/336
(52) U.S. Cl. ................... 438/299; 438/301; 438/303; 438/307; 257/336; 257/344; 257/408
(58) Field of Search ................................ 438/299, 301, 438/303, 307; 257/336, 344, 408

(56) References Cited

U.S. PATENT DOCUMENTS 6,335,249 B1 * 1/2002 Thei et al. ................... 438/296
6,423,589 B2 * 7/2002 Park et al. ................... 438/231
6,734,071 B1 * 5/2004 Honeycutt et al. .......... 438/301
6,737,308 B2 * 5/2004 Kim ............................ 438/197

FOREIGN PATENT DOCUMENTS

JP 2001-118933 4/2001

* cited by examiner

Primary Examiner—Trung Dang
(74) Attorney, Agent, or Firm—Westerman, Hattori, Daniels & Adrian, LLP

(57) ABSTRACT

On a semiconductor substrate having a gate electrode and an LDD layer formed thereon, an SiN film to be a silicide block is formed. An opening communicating with the LDD layer is provided for the SiN film. Impurities are introduced into the LDD layer through the opening to form a source/drain layer, and the surface thereof is silicided to form a silicide film. Next, an interlayer insulation film of $SiO_2$ is formed and then etched under a condition of an etching rate of $SiO_2$ higher than that of SiN to form a contact hole reaching the LDD layer from the upper surface of the interlayer insulation film via the opening.

13 Claims, 32 Drawing Sheets

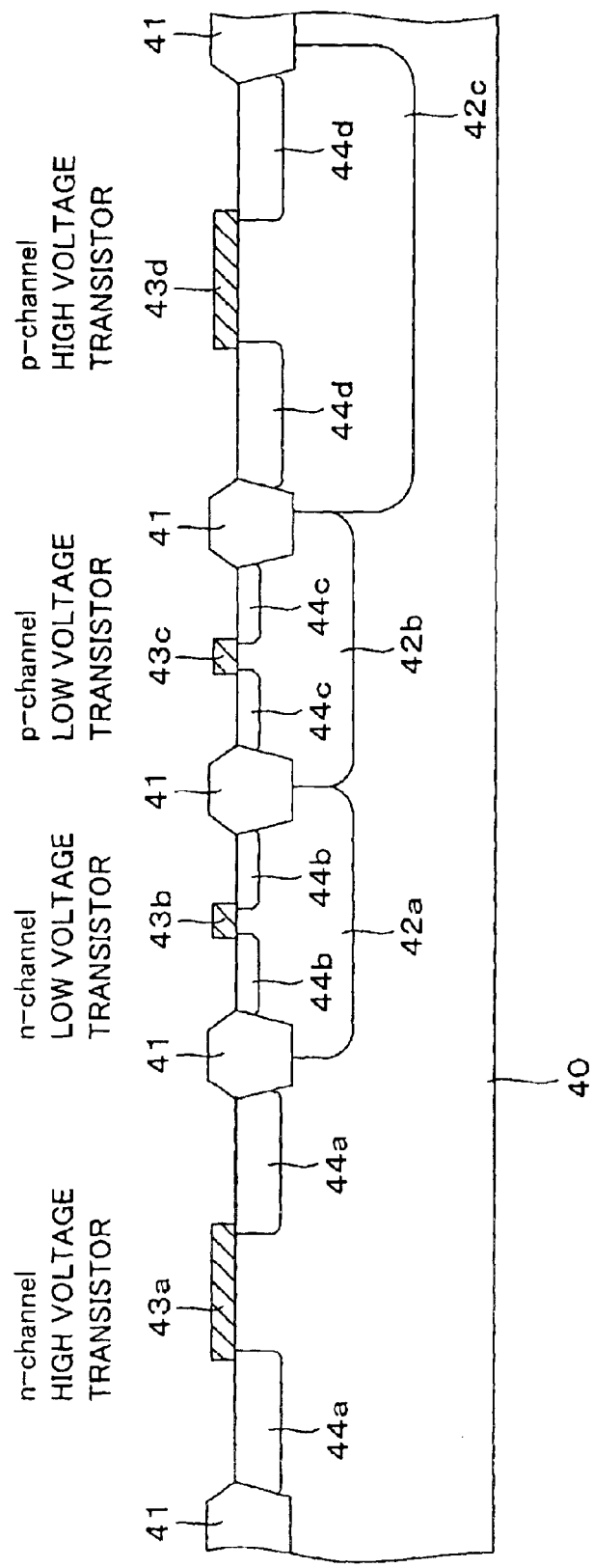

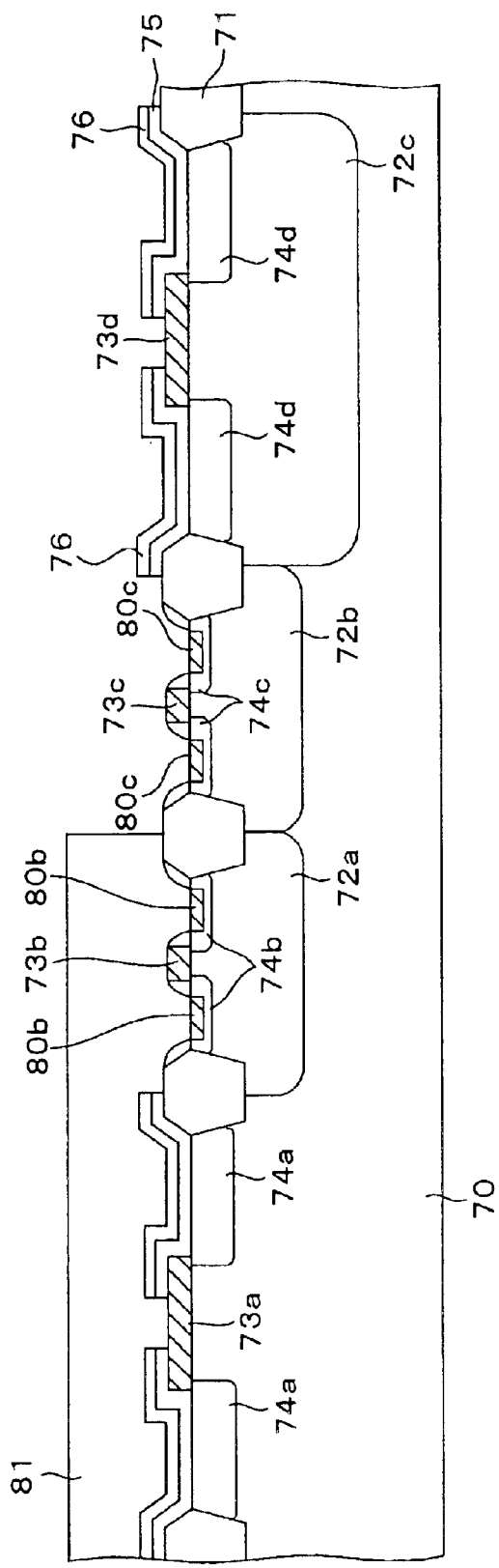

SEMICONDUCTOR DEVICE AND MANUFACTURING METHOD FOR THE SAME

CROSS-REFERENCE TO RELATED APPLICATIONS

This application is based upon and claims priority of Japanese Patent Application No. 2002-240540, filed on Aug. 21, 2002, the contents being incorporated herein by reference.

BACKGROUND OF THE INVENTION

1. Field of the Invention

The present invention relates to a semiconductor device where an element and wiring are connected via a silicide film, and a manufacturing method for the same. Particularly, the present invention relates to a semiconductor device including a transistor operating at low voltage and a transistor driven at high voltage like flush memory, and relates to a manufacturing method for the same.

2. Description of the Prior Art

A semiconductor device such as flush memory is composed of low voltage transistors operating at low voltage of 5 V or lower and high voltage transistors operating at high voltage of about 20 V, which are mixedly mounted.

FIG. 1 is a sectional view showing a connecting portion of the high voltage transistor and wiring in a conventional semiconductor device. With reference to the FIG. 1, a manufacturing method for the conventional semiconductor device will be described.

First, a trench is formed at a predetermined position of a semiconductor substrate 10. The trench is filled with an insulating material such as $SiO_2$ (silicon oxide) to form an element isolation film 11. A surface of the semiconductor substrate 10 is then oxidized to form a gate insulation film (not shown). On the gate insulation film, a gate electrode 12 is formed in a predetermined pattern.

Thereafter, impurities are introduced into the surface of the semiconductor substrate 10 at comparatively low concentration using the gate electrode 12 as a mask to form a lightly doped drain (LDD) layers 13. The LDD layer 13 is formed on both sides of the gate electrode 12, but only one LDD layer 13 is shown in FIG. 1.

Over the entire upper surface of the semiconductor substrate 10, an insulation film such as $SiO_2$ is formed. The insulation film is anisotropically etched to be left only on both sides of the gate electrode 12 as sidewalls 14.

Over the entire upper surface of the semiconductor substrate 10, an insulating material such as $SiO_2$ is deposited to form an interlayer insulation film 15. The gate electrode 12, the LDD layer 13, the element isolation film 11 and the like are covered with this interlayer insulation film 15.

Subsequently, the interlayer insulation film 15 is selectively etched with photolithography to form a contact hole 15h reaching the LDD layer 13. Then, impurities are ion-implanted at high concentration into the surface of the semiconductor substrate 10 through the contact hole 15h to form a source/drain layer 13a.

The contact hole 15h is then filled with an electrical conductor such as metal to form a contact plug 15a. Subsequently, a metallic film is formed on the interlayer insulation film 15 and then patterned by photolithography to form wiring 16.

In the semiconductor device manufactured in such a manner, a withstanding voltage of the transistor relates to a distance a between the source/drain layer 13a and the gate electrode 12. The longer the distance a is, the higher the withstanding voltage of the transistor is.

In recent years, miniaturization of the semiconductor devices tends to be further accelerated. Along with the miniaturization, the area of a contact portion between the wiring and any one of the gate electrode and the source/drain layer has been reduced. Accordingly, in order to further improve properties of the contact portion, a silicide film formed by a salicide process has become used.

FIG. 2 is a sectional view showing another example of the conventional semiconductor device. With reference to FIG. 2, a conventional method of manufacturing a semiconductor device including the salicide process will be described.

First, impurities are ion-implanted at high concentration into an element isolation region of the semiconductor substrate 20 to form an impurity region 21 for element isolation. A surface of the semiconductor substrate 20 in the element isolation region is oxidized to form an element isolation film 22.

The surface of the semiconductor substrate 20 in an element region is then oxidized to form a gate insulation film (not shown). On the gate insulation film, a gate electrode 23 is formed of polysilicon in a predetermined pattern. Subsequently, impurities are ion-implanted into the semiconductor substrate 20 at low concentration using the gate electrode 23 as a mask to form LDD layers 24. The LDD layers 24 are formed on both sides of the gate electrode 23.

Over the entire upper surface of the semiconductor substrate 20, an SiN (silicon nitride) film 25 to be a silicide block is then formed and patterned in a predetermined shape. Impurities are then ion-implanted at high concentration into each LDD layer 24 through an opening of the SiN film 25 to form a source/drain layer 24a. Over the entire upper surface of the semiconductor substrate 20, a metallic film such as cobalt or tungsten is formed and then heat-treated to form suicide films 26a and 26b on the surfaces of the gate electrode 23 and the source/drain layer 24a, respectively. Unreacted part of the metallic film is then removed by etching.

Subsequently, an insulation film such as $SiO_2$ is deposited on the entire upper surface of the semiconductor substrate 20 to form an interlayer insulation film 27. In the interlayer insulation film 27, a contact hole 27h reaching the source/drain layer 24a is formed and filled with a conductive material to form a contact plug 27a.

A metallic film is then formed on the interlayer insulation film 27 and patterned by photolithography to form wiring 28. In such a manner, the semiconductor device is completed.

However, the inventors consider that there is a problem shown below in the above described conventional method of manufacturing a semiconductor device.

In the semiconductor device shown in FIG. 2, the withstanding voltage of the transistor relates to a distance a between the gate electrode 23 and the source/drain layer 24a. On the other hand, when the contact hole 27h is formed in the interlayer insulation film 27 by photolithography, a margin b is necessary for mask alignment. The size of the silicide film 26b thereby needs to be larger than a size c of an end tip of the contact hole 27h. Accordingly, in the conventional method of manufacturing the semiconductor device, the transistor is increased in size by the margin b for mask alignment, that is, by the distance between an edge of the source/drain layer 24a and the contact plug 27a, thus limiting density improvement of the semiconductor device.

SUMMARY OF THE INVENTION

In the light of the above problem, an object of the present invention is to provide a semiconductor device including a silicide film on a gate electrode or a source/drain layer and allowing further density improvement compared with the conventional one, and a manufacturing method for the same.

The above subject is solved by a semiconductor device including: a semiconductor substrate; a gate electrode formed on the semiconductor substrate; a low concentration impurity layer formed by introducing impurities at a low concentration into the semiconductor substrate on each side of the gate electrode; a first insulation film formed at least on the low concentration impurity layer; an opening provided in the first insulation film to expose part of the low concentration impurity layer; a source/drain layer formed by introducing impurities into the low concentration impurity layer at a position aligned with the opening at a concentration higher than that of the low concentration impurity layer; a silicide film formed by siliciding a surface of the source/drain layer; a second insulation film formed on the semiconductor substrate to cover the gate electrode and the first insulation film; a contact hole formed in a width larger than that of the opening at a position aligned with the opening in the second insulation film, the contact hole reaching the source/drain layer from a upper surface of the second insulation film via the opening; a contact plug formed by filling the contact hole with an electrical conductor; and wiring formed on the second insulation film and electrically connected to the silicide film via the contact plug.

In the present invention, the source/drain layer is formed at the position aligned with the opening of the first insulation film. In the present invention, the opening of the first insulation film (silicide block) is formed in a width smaller than that of the contact hole, and the silicide film on the source/drain layer and the contact plug are connected to each other via the opening. Accordingly, the distance between the gate electrode and the source/drain layer can be minimized, thus allowing density improvement of the semiconductor device while ensuring a required withstanding voltage.

The above subject can be solved by a manufacturing method for a semiconductor device including the steps of: forming a gate electrode on a semiconductor substrate; forming a low concentration impurity layer by introducing impurities into the semiconductor substrate at a low concentration using the gate electrode as a mask; forming a first insulation film on the semiconductor substrate and the gate electrode, and forming an opening exposing part of the low concentration impurity layer by patterning of the first insulation film; forming a source/drain layer by introducing impurities into the low concentration impurity layer through the opening at a concentration higher than that of the low concentration impurity layer; forming a silicide film by siliciding a surface of the source/drain layer inside the opening; forming a second insulation film over an entire upper surface of the semiconductor substrate; forming a contact hole exposing the silicide film by etching the second insulation film in a width larger than that of the opening of the first insulation film; forming a contact plug by filling the contact hole with an electrical conductor; and forming wiring on the second insulation film, the wiring being electrically connected to the silicide film via the contact plug.

In the present invention, the source/drain layer is formed by introducing impurities at a high concentration into the low concentration impurity layer through the opening of the first insulation film. Accordingly, the source/drain layer is approximately the same as the opening in size.

Subsequently, the second insulation film is formed on the semiconductor substrate, and the contact hole with a width larger than that of the opening of the first insulation film is formed by etching the second insulation film. At this time, if the etching is carried out under the condition where the etching rate of the second insulation film is kept higher than that of the first insulation film, the first insulation film is hardly etched. Accordingly, the space within the opening becomes as an end tip of the contact hole on the substrate side.

Consequently, the distance between the contact hole and the edge of the source/drain layer becomes almost zero, and the distance between the contact hole and the gate electrode is reduced compared with the conventional one. This enables the semiconductor device to be highly integrated.

Furthermore, the above described subject is solved by a semiconductor device including: a semiconductor substrate; a gate electrode formed on the semiconductor substrate; a low concentration impurity layer formed by introducing impurities at a low concentration into the semiconductor substrate on each side of the gate electrode; a first insulation film formed on the low concentration impurity layer and the gate electrode; an opening provided in the first insulation film, the opening exposing part of the gate electrode; a silicide film formed by siliciding a surface of the gate electrode inside the opening; a second insulation film formed on the semiconductor substrate to cover the gate electrode and the first insulation film; a contact hole reaching the low concentration impurity layer from a upper surface of the second insulation film; a source/drain layer formed by introducing impurities into the low concentration impurity layer at a position aligned with the contact hole at a concentration higher than that of the low concentration impurity layer; a contact plug formed by filling the contact hole with an electrical conductor; and wiring formed on the second insulation film and electrically connected to the source/drain layer via the contact plug.

In the present invention, the silicide film is formed on the gate electrode using the first insulation film as a silicide block. The contact hole reaching the low concentration impurity layer from the upper surface of the second insulation film (interlayer insulation film) is formed. The source/drain layer is formed by introducing impurities at a high concentration into the low concentration impurity layer through the contact hole. Accordingly, the distance between the contact hole and the edge of the source/drain layer is almost zero, and density improvement of the semiconductor device is attained.

Still furthermore, the above described subject is solved by a manufacturing method for a semiconductor device, including the steps of: forming a gate electrode on a semiconductor substrate; forming a low concentration impurity layer by introducing impurities at a low concentration into the semiconductor substrate using the gate electrode as a mask; forming a first insulation film over an entire upper surface of the semiconductor substrate, and then forming an opening exposing part of the gate electrode by patterning the first insulation film; forming a silicide film by siliciding a surface of the gate electrode inside the opening; forming a second insulation film over an entire upper surface of the semiconductor substrate; forming a contact hole reaching the low concentration impurity layer from a upper surface of the second insulation film; forming a source/drain layer by introducing impurities into the low concentration impurity layer through the contact hole at a concentration higher than that of the low concentration impurity layer; forming a contact plug by filling the contact hole with an electrical conductor; and forming wiring on the second insulation film, the wiring being electrically connected to the source/drain layer via the contact plug.

In the present invention, the silicide film is formed on the gate electrode using the first insulation film as a silicide block. After the second insulation film (interlayer insulation film) is formed, the contact hole is formed, which reaches the low concentration impurity layer from the upper surface of the second insulation film. Thereafter, impurities are introduced at a high concentration into the low concentration impurity layer through the contact hole to form the source/drain layer. Accordingly, the distance between the contact hole and the edge of the source/drain layer becomes almost zero, and density improvement of the semiconductor is attained.

BRIEF DESCRIPTION OF THE DRAWING

FIGS. 5A to 5I are sectional views showing an example of a manufacturing method for a semiconductor device including both a low voltage transistor and a high voltage transistor to which the manufacturing method for a semiconductor device of the first embodiment is applied.

FIGS. 10A to 10L are sectional views showing an example of a manufacturing method for a semiconductor device including both a low voltage transistor and a high voltage transistor to which the manufacturing method for the semiconductor device of the second embodiment is applied.

DESCRIPTION OF THE PREFERRED EMBODIMENT

A description will be made below for embodiments of the present invention with reference to the accompanying drawings.

First Embodiment

FIGS. 3A to 3D are sectional views showing a manufacturing method for a semiconductor device according to a first embodiment of the present invention in a process order.

Figure 1:
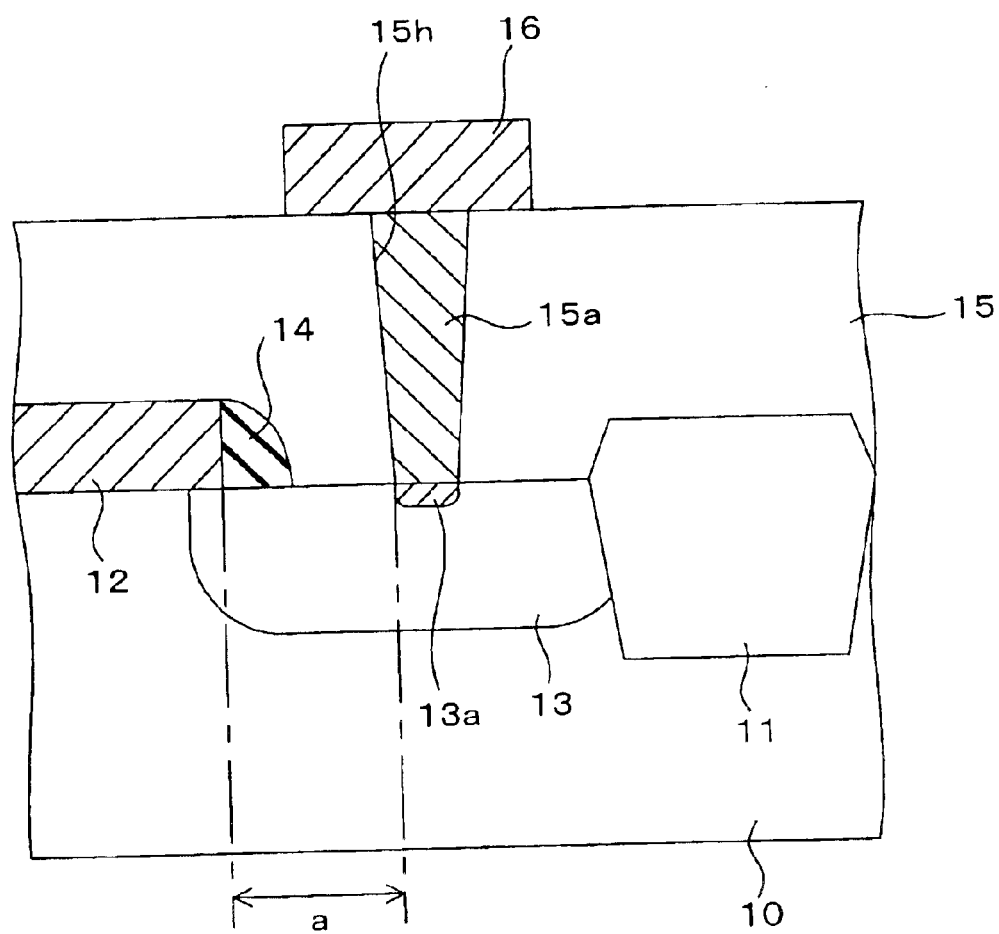
FIG. 1 is a sectional view showing a connecting portion of a high voltage transistor and wiring in a conventional semiconductor device.
Figure 2:
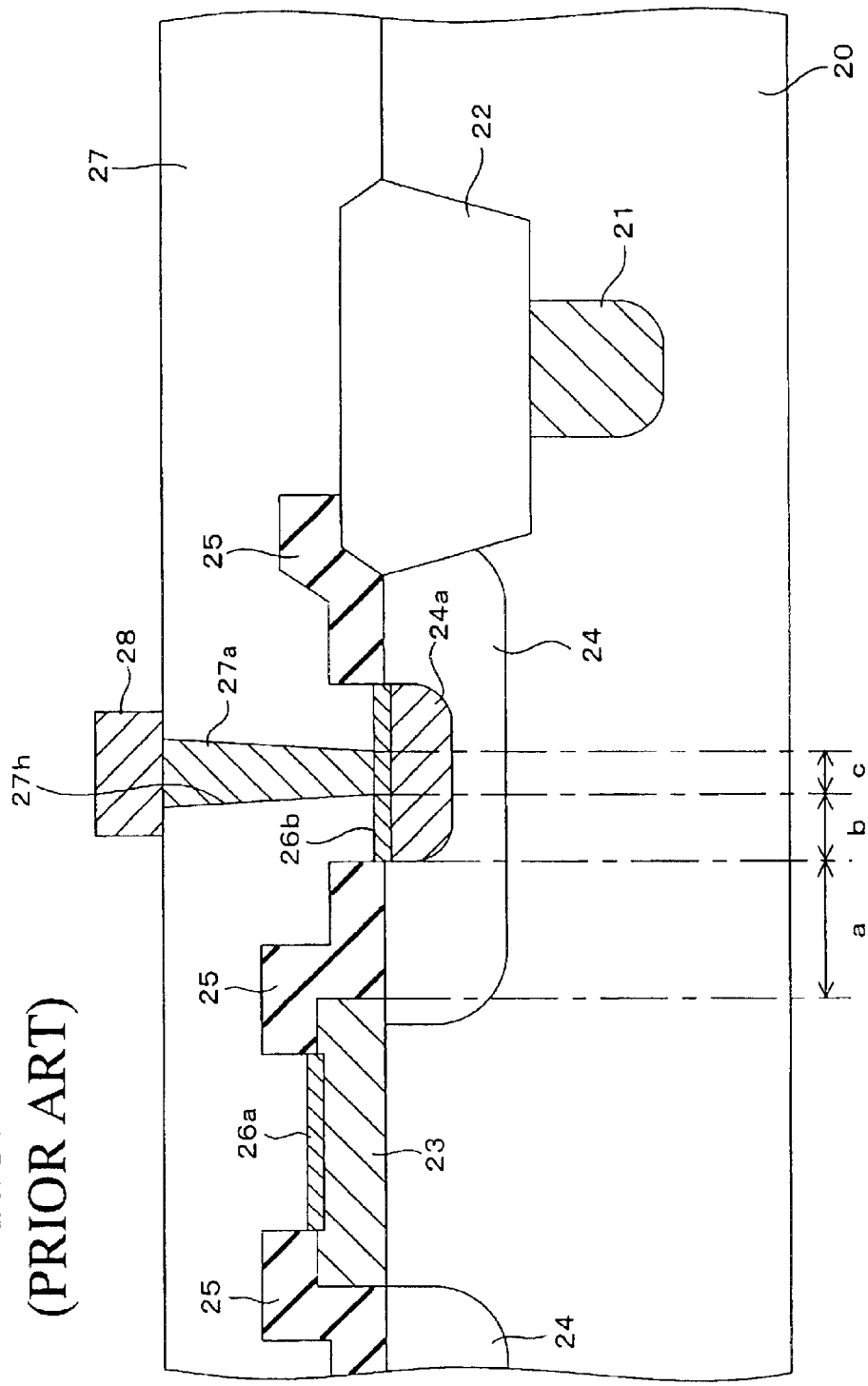
FIG. 2 is a sectional view showing another example of the conventional semiconductor device.
Figure 3A:
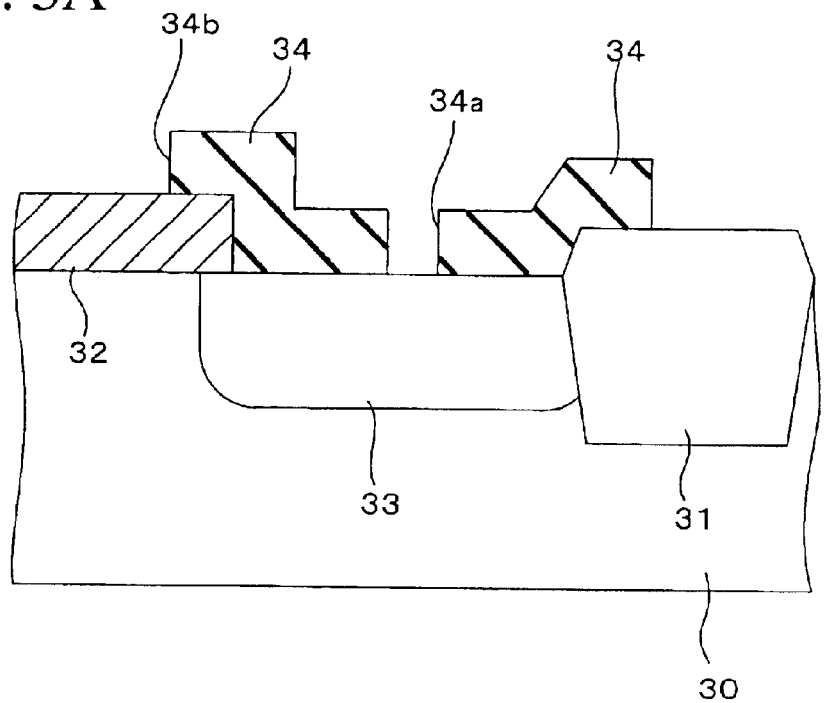
FIGS. 3A to 3D are sectional views showing a manufacturing method for a semiconductor device according to a first embodiment of the present invention.

First, as shown in FIG. 3A, a trench is formed in an element isolation region of a semiconductor substrate 30. The trench is filled with an insulating material such as $SiO_2$ to form an element isolation film 31. A surface of the semiconductor substrate 30 in an element region is then oxidized to form a gate insulation film (not shown). On the gate insulation film, a gate electrode 32 is formed of polysilicon in a predetermined pattern.

Subsequently, impurities are ion-implanted at low concentration into the surface of the semiconductor substrate 30 using the gate electrode 32 as a mask to form an LDD layer 33. Over the entire upper surface of the semiconductor substrate 30, an SiN film 34 to be a silicide block is formed, for example, in a thickness of 115 nm. The SiN film 34 is patterned in a predetermined shape by photolithography to form an opening 34*a* where part of the LDD layer 33 is exposed and an opening 34*b* where part of the gate electrode 32 is exposed. The opening 34*a* is, for example, 180 nm in width, and the opening 34*b* is, for example, 360 nm×360 nm in size. Note that the silicide block may use, for example, a two layer film composed of an $SiO_2$ layer (lower layer) with a thickness of 15 nm and an SiN layer (upper layer) with a thickness of 100 nm.

In the embodiment, when the opening 34*a* of the SiN film 34 is formed, it is not necessary to take into consideration a margin for mask alignment in formation of the contact hole. In other words, the opening 34*a* may be set to a minimum size necessary for connection between a contact plug and a source/drain layer, which will be described later.

Figure 3B:
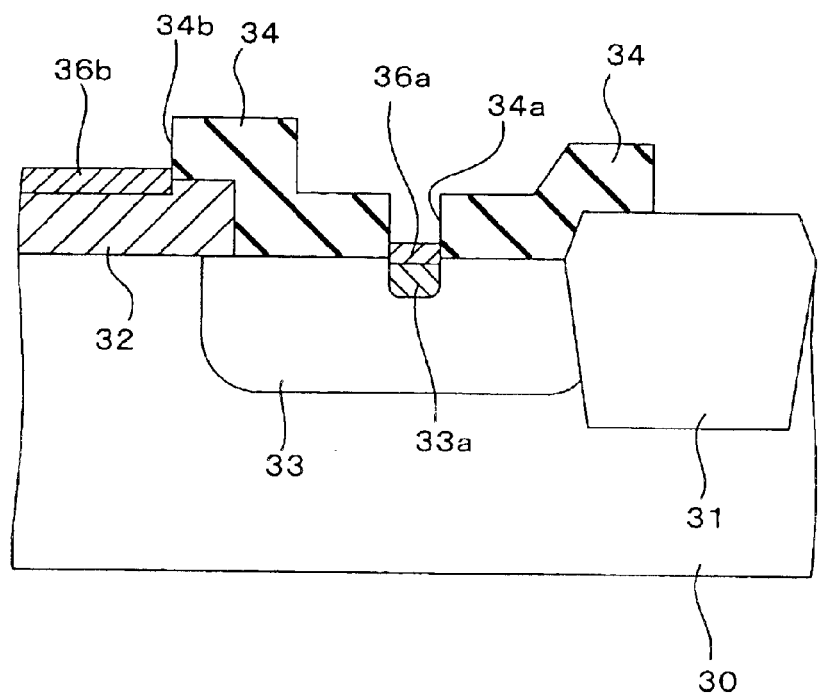

As shown in FIG. 3B, impurities are ion-implanted at high concentration into the surface of the LDD layer 33 through the opening 34*a* of the SiN film 34 to form a source/drain layer 33*a*. Thereafter, a metallic film such as cobalt or tungsten is formed over the entire upper surface of the semiconductor substrate 30 and heat-treated. This causes metal atoms in the metallic film and silicon atoms in the surface of the gate electrode 32 and the LDD layer 33 react with each other, so that silicide films 36*a* and 36*b* are formed on the LDD layer 33 and the gate electrode 32, respectively. Unreacted part of the metallic film is then removed by etching.

Figure 3C:
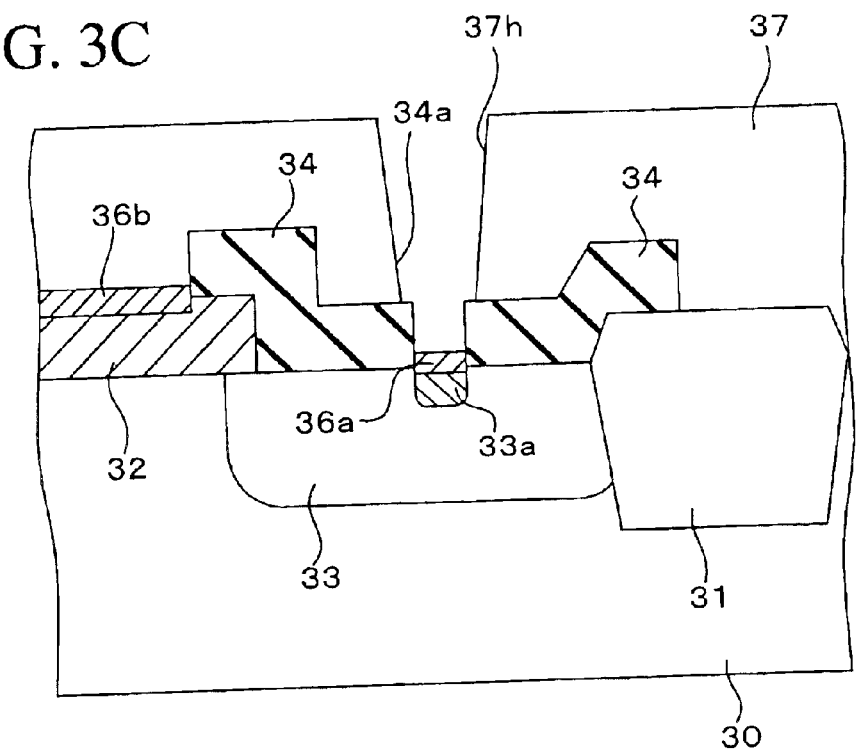

As shown in FIG. 3C, over the entire upper surface of the semiconductor substrate 30, an interlayer insulation film 37 is formed of an insulating material such as $SiO_2$, for example, in a thickness of 650 nm. The interlayer insulation film 37 is then etched by photolithography to form a contact hole 37*h* reaching the silicide film 36*a* on the source/drain layer 33. In this case, the contact hole 37*h* is formed at a position aligned with that of the opening 34*a* of the SiN film 34, and the size of the contact hole 37*h* is determined in consideration of the margin for mask alignment. Specifically, the size of the contact hole 37*h* is set larger than that of the opening 34*a* of the SiN film 34 by the margin size for mask alignment. When the interlayer insulation film 37 is etched under a condition of a high etching selectivity of $SiO_2$ and SiN, the SiN film 34 is hardly etched, and the end tip position of the contact hole 37*h* is self-aligningly decided (that is, at the position of the opening 34*a* of the SiN film 34).

Figure 3D:
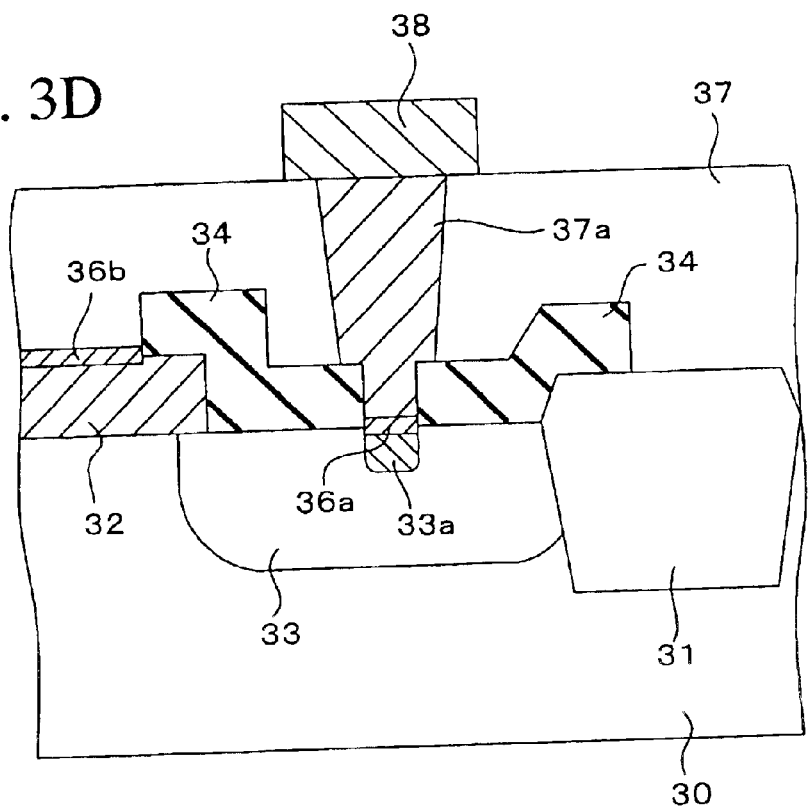

Subsequently, as shown in FIG. 3D, the contact hole 37*h* is filled with metal such as tungsten (W) to form a contact plug 37*a*. Specifically, over the entire upper surface of the semiconductor substrate 30, a titanium (Ti) film, for example, with a thickness of 40 nm and a titanium nitride (TiN) film, for example, with a thickness of 15 nm are sequentially formed, and the wall surface and the bottom surface in the contact hole 37h are covered with the Ti film and the TiN film. Tungsten is then deposited over the entire upper surface of the semiconductor substrate 30. The contact hole 37h is thereby filled with tungsten, and a tungsten film is formed on the interlayer insulation film 37. The tungsten film, the Ti film, and the TiN film are then polished and removed by Chemical Mechanical Polishing (CMP) until the interlayer insulation film 37 is exposed. The tungsten, the TiN film, and the Ti film remaining in the contact hole 37h constitute the contact plug 37a.

Figure 4:
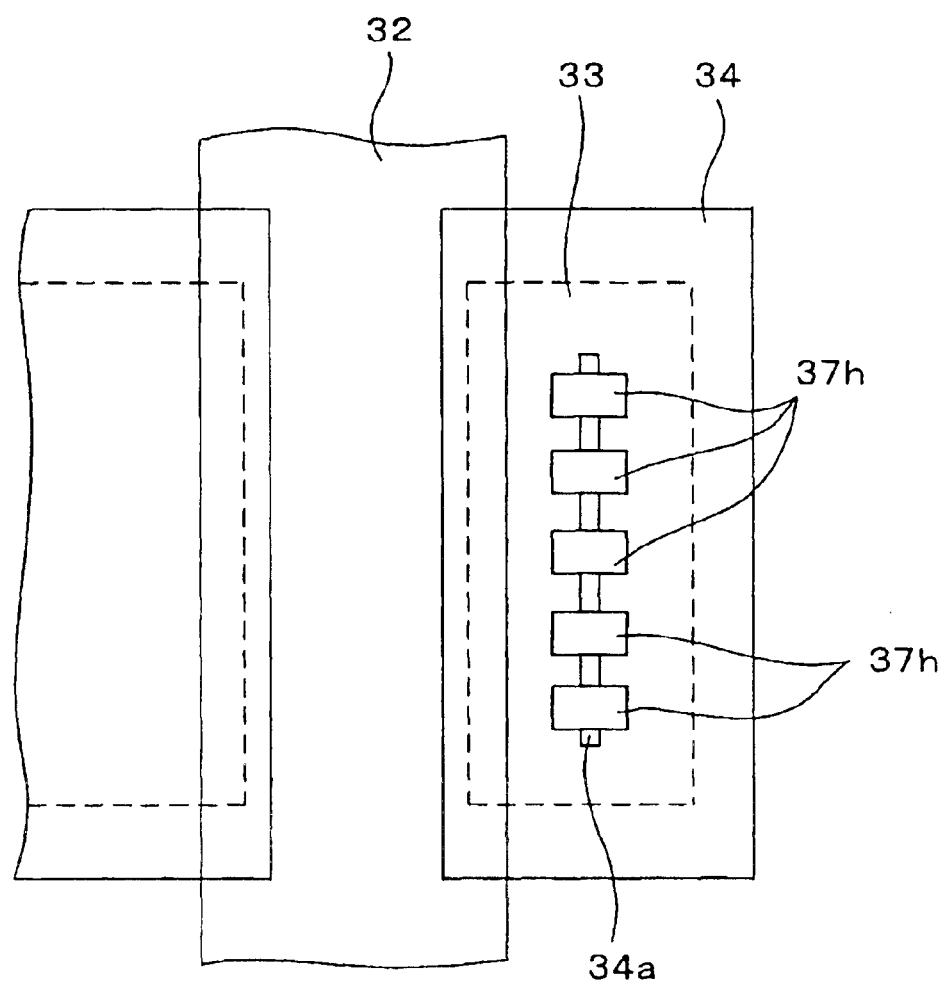
FIG. 4 is a top view schematically showing examples of shapes of an opening of an SiN film and contact holes.

As shown in the top view of FIG. 4, for example, the opening 34a of the SiN film 34 is formed as a slit parallel to the gate electrode 32, and the contact holes 37h are arranged at constant intervals along the slit 34a.

Then, on the interlayer insulation film 37, a metallic film is formed. The metallic film is a laminated film, for example, including a Ti film with a thickness of 20 nm, a TiN film with a thickness of 50 nm, an aluminum (Al) film of 500 nm and a TiN film with a thickness of 100 nm, which are laminated in this order. The metallic film is then patterned by photolithography to form wiring. A predetermined wiring line 38 in the wiring is electrically connected to the source/drain layer 33a via the contact plug 37a and the silicide film 36a. The semiconductor device is thus completed.

In this embodiment, the end tip position of the contact hole 37h is self-aligningly determined using the opening 34a of the SiN film 34 as the silicide block. Accordingly, the distance between the gate electrode 32 and the source/drain layer 33a does not relate to the margin for alignment in the formation of the contact hole 37h. Therefore, the distance between the source/drain layer 33a and the gate electrode 32 can be made small and density improvement of the semiconductor can be attained. In this embodiment, since the source/drain layer 33a and the contact plug 37a are electrically connected via the silicide film 36a, contact property is excellent.

FIGS. 5A to 5I are sectional views showing a manufacturing method for a semiconductor device including a low voltage transistor and a high voltage transistor to which the manufacturing method for a semiconductor device of the first embodiment of the present invention is applied.

First, as shown in FIG. 5A, trenches are formed in element isolation regions of a p-type silicon semiconductor substrate 40. The trenches are filled with an insulating material such as $SiO_2$ to form element isolation films 41. Note that, instead of the above described Shallow Trench Isolation (STI), the element isolation films may be formed by Local Oxidation of Silicon (LOCOS).

Subsequently, p-type impurities or n-type impurities are selectively introduced into a formation region of an n-channel low voltage transistor, a formation region of a p-channel low voltage transistor and a formation region of a p-channel high voltage transistor to form a p well 42a, an n well 42b and a n well 42c, respectively.

Surfaces of the semiconductor substrate 40 in element regions are then oxidized to form gate insulation films (not shown). On the gate insulation films in a formation region of an n-channel high voltage transistor, the formation region of the n-channel low voltage transistor, the formation region of the p-channel low voltage transistor and the formation region of the p-channel high voltage transistor, gate electrodes 43a, 43b, 43c and 43d are formed in predetermined shapes, respectively.

Subsequently, n-type impurities are introduced at low concentration into the surface of the semiconductor substrate 40 using the gate electrode 43a as a mask to form LDD layers 44a of the n-channel high voltage transistor. Further, n-type impurities are introduced into the surface of the p well 42a at low concentration using the gate electrode 43b as a mask to form LDD layers 44b of the n-channel low voltage transistor.

Similarly, p-type impurities are introduced at low concentration into the surface of the n well 42b using the gate electrode 43c as a mask to form LDD layers 44c of the p-channel low voltage transistor. Further, p-type impurities are introduced at low concentration into the surface of the n well 42c using the gate electrode 43d as a mask to form LDD layers 44d of the p-channel high voltage transistor.

Figure 5B:
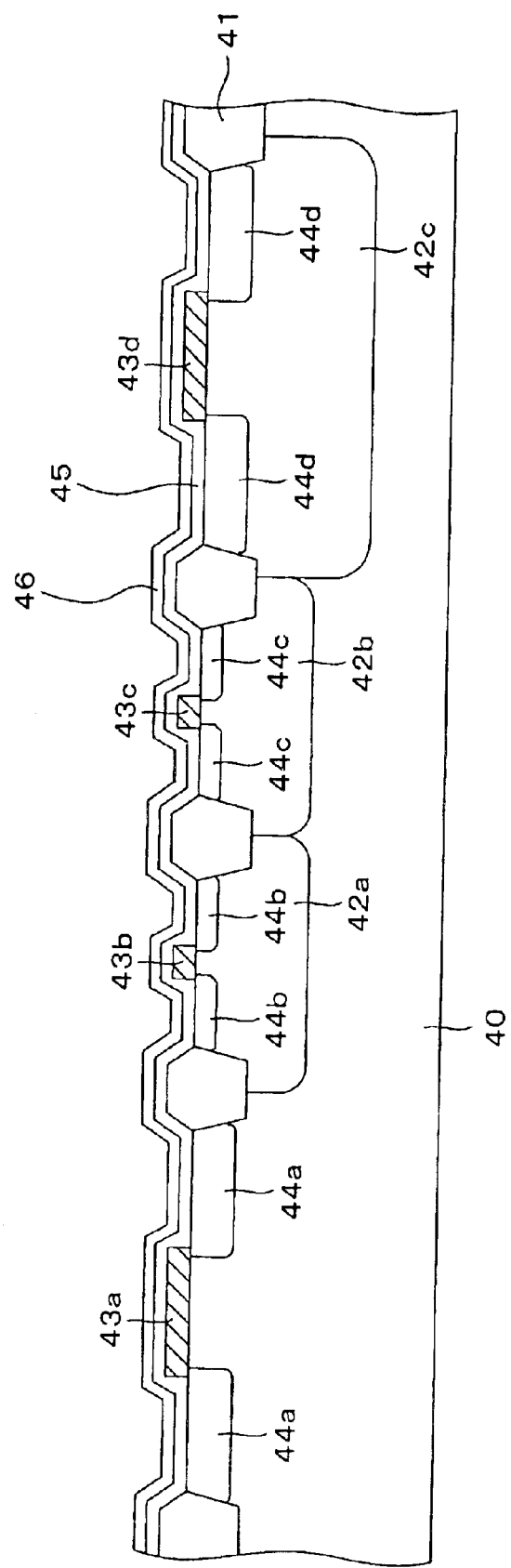

Subsequently, as shown in FIG. 5B, an $SiO_2$ film 45 is formed over the entire upper surface of the semiconductor substrate 40, and an SiN film 46 to be silicide blocks is further formed thereon. In this embodiment, sidewalls on both sides of each of the gate electrodes 43b and 43c are formed of the $SiO_2$ film 45 and the SiN film 46, but the sidewalls can be formed of only any one of the $SiO_2$ film and the SiN film.

Figure 5C:
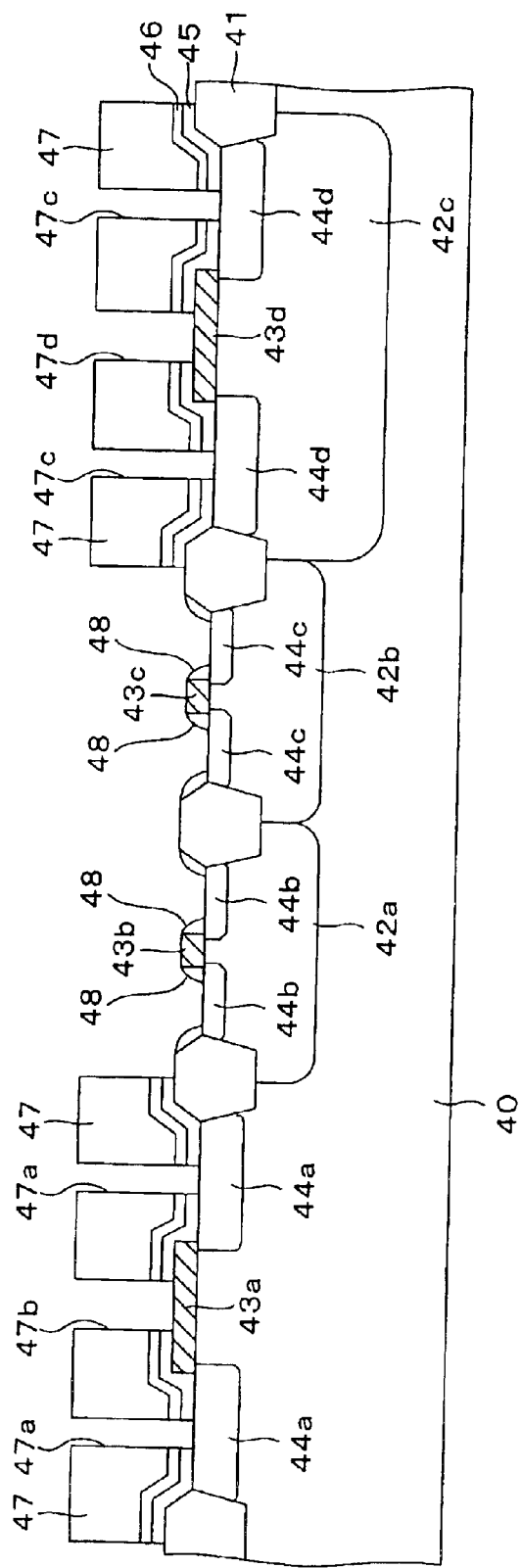

Subsequently, a photoresist film is formed on the SiN film 46, and exposure and development are performed to form resist films 47 covering regions where the silicide film is not formed as shown in FIG. 5C. The SiN film 46 and the $SiO_2$ film 45 are anisotropically etched using the resist films 47 as masks.

By such anisotropic etching, the gate electrodes 43b and 43c of the low voltage transistors and the LDD layers 44b and 44c of the same are exposed, and part of each LDD layer 44a and part of the gate electrode 43a of the n-channel high voltage transistor and part of each LDD layer 44d and part of the gate electrode 43d of the p-channel high voltage transistor are exposed through openings 47a, 47b, 47c and 47d of the resist films 47, respectively. On side portions of each of the gate electrodes 43b and 43c, sidewalls (self-aligned sidewalls) 48 are formed of the $SiO_2$ film 45 and the SiN film 46.

Figure 6A:
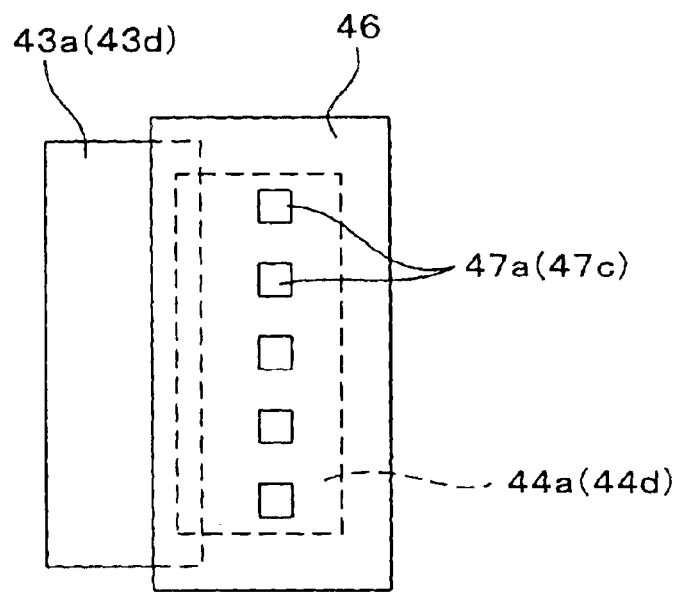
FIGS. 6A and 6B are views, each showing an example of a shape of each opening in a formation region of the high voltage transistor of the first embodiment.
Figure 6B:
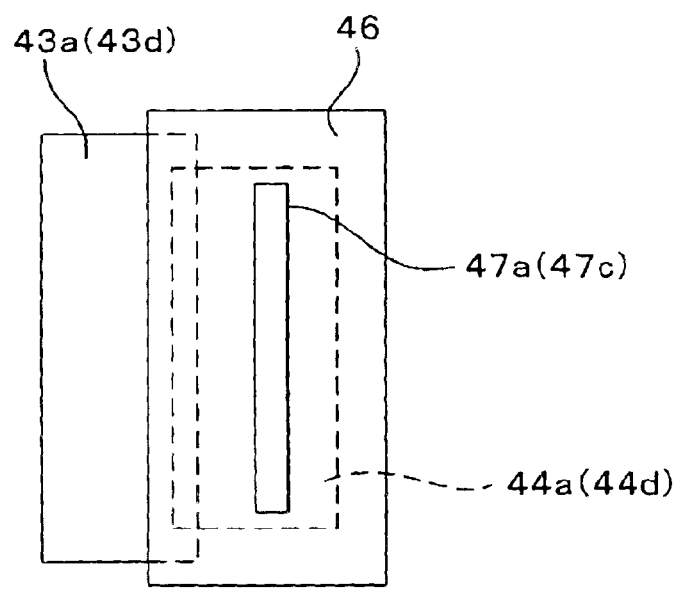
Figure 7A:
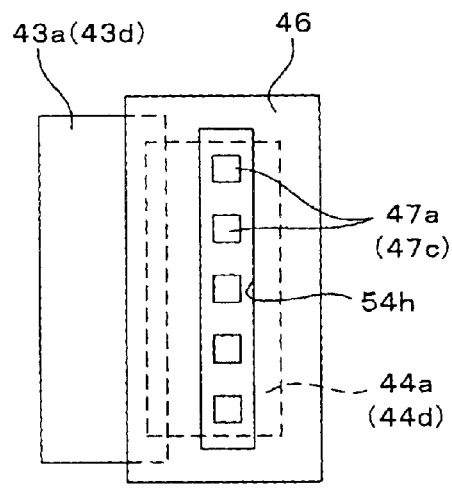
FIGS. 7A to 7D are views, each showing an example of a shape of each contact hole in the formation region of the high voltage transistor of the first embodiment.
Figure 7B:
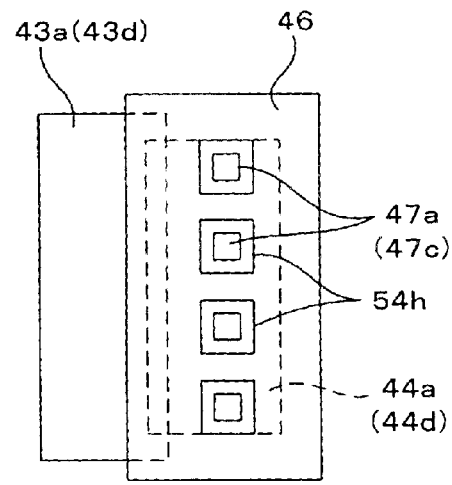
Figure 7C:
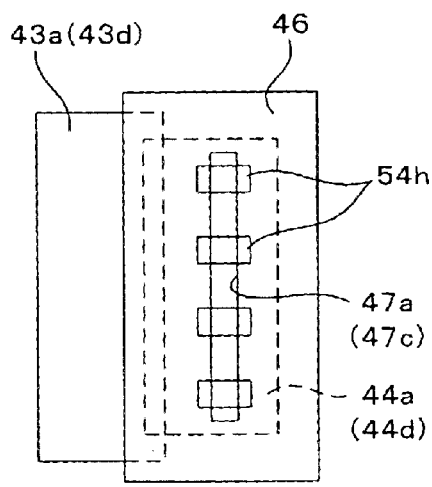
Figure 7D:
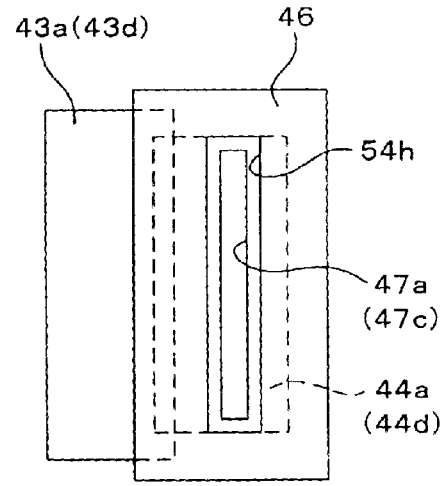

As shown in FIGS. 6A and 6B, the opening 47a (or the opening 47c) is shaped as a plurality of rectangles arranged along the gate electrode 43a (43d), or alternatively, slit-shaped along the gate electrode 43a (43d).

Figure 5D:
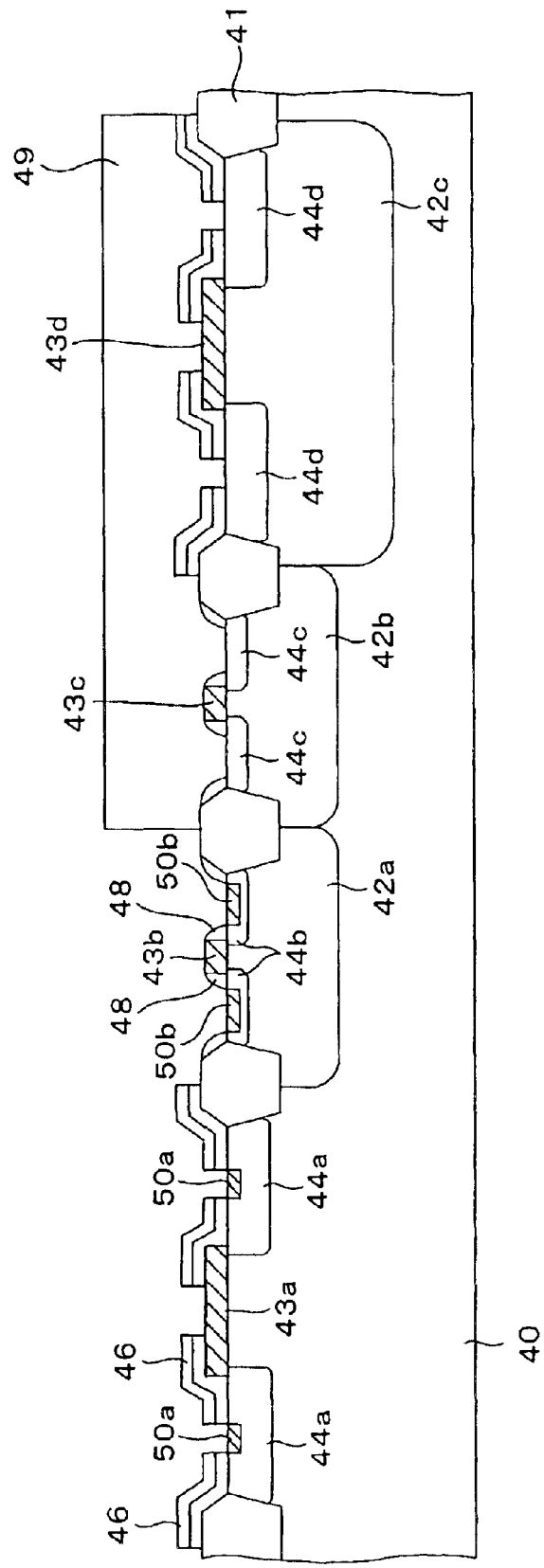

After the resist films 47 are removed, as shown in FIG. 5D, a photoresist film 49 is formed, which covers the formation region of the p-channel low voltage transistor and the formation region of the p-channel high voltage transistor. N-type impurities are then ion-implanted at high concentration into the LDD layers 44a and 44b of the n-channel high voltage transistor and the n-channel low voltage transistor using the SiN film 46 and the sidewalls 48 as masks to form source/drain layers 50a and 50b, respectively. The resist film 49 is then removed.

Figure 5E:
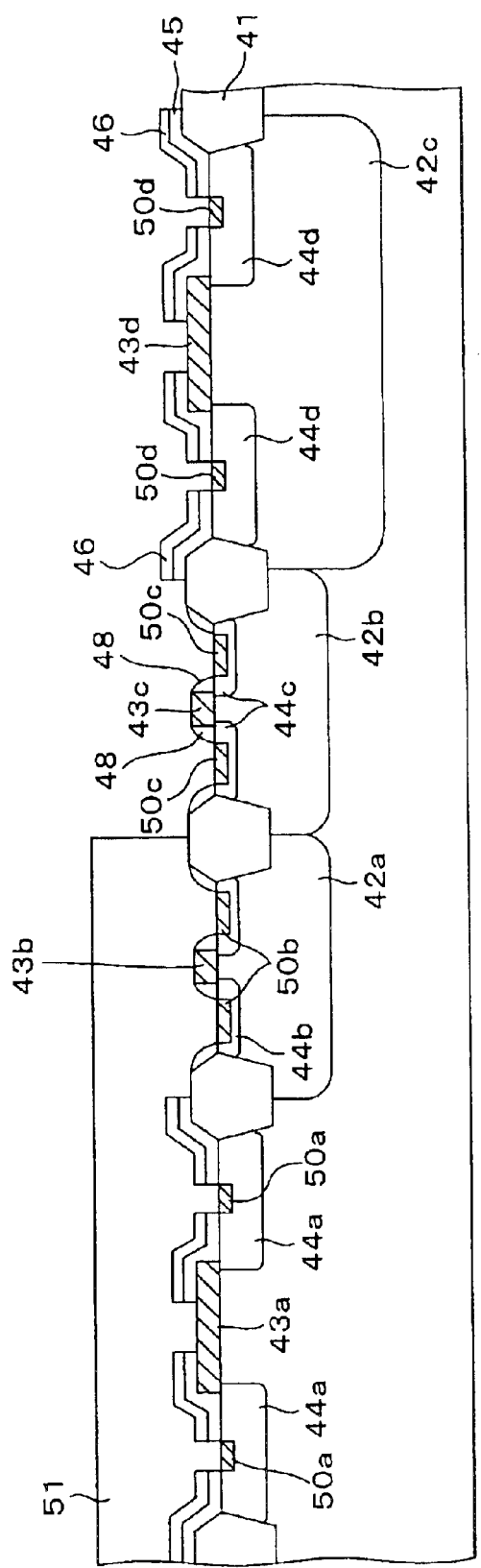

Subsequently, as shown in FIG. 5E, a photoresist film 51 is formed, which covers the formation region of the n-channel low voltage transistor and the formation region of the n-channel high voltage transistor. P-type impurities are then ion-implanted into the LDD layers 44c and 44d of the p-channel low voltage transistor and the p-channel high voltage transistor using the SiN film 46 and the sidewalls 48 as masks to form source/drain layers 50c and 50d, respectively. The resist film 51 is then removed.

Figure 5F:
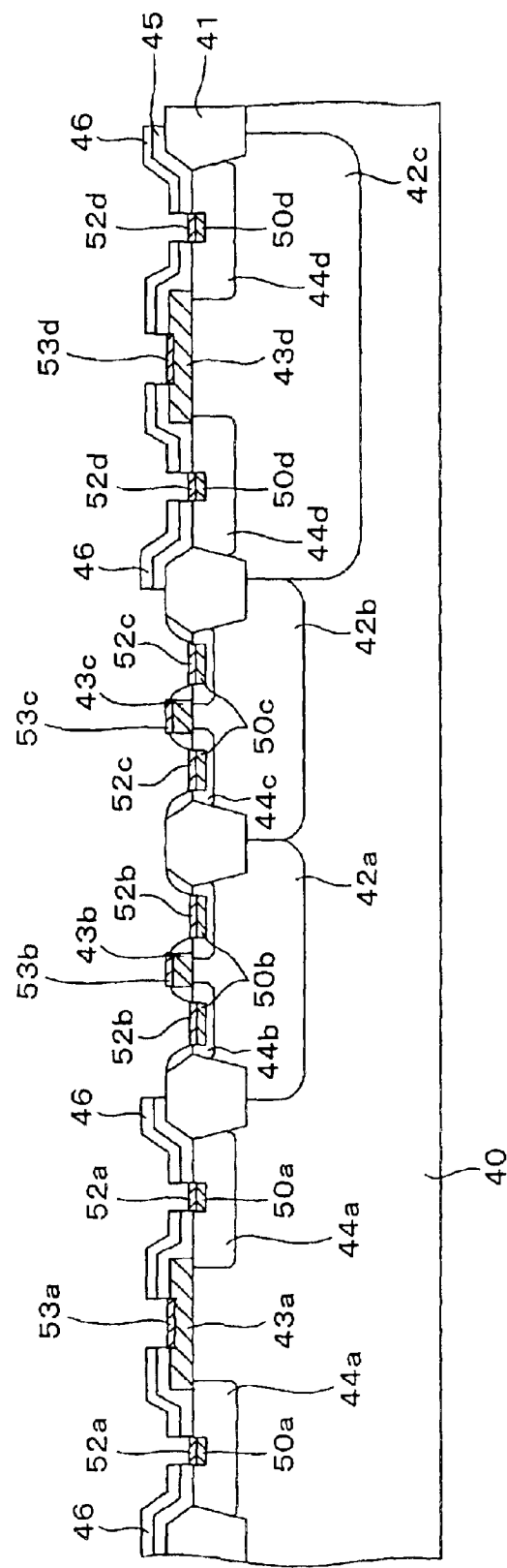

A metallic film such as cobalt or tungsten is formed over the entire upper surface of the semiconductor substrate 40 and heat-treated. This causes metal atoms in the metallic film and silicon atoms in the silicon film react with each other in part where the metallic film and the silicon film are in contact with each other, thus forming silicide films 52a, 52b, 52c, 52d, 53a, 53b, 53c and 53d on the source/drain layers 50a, 50b, 50c and 50d, the gate electrode 43a, 43b, 43c and 43d, respectively, as shown in FIG. 5F. Unreacted part of the metallic film is then removed by etching.

Figure 5G:
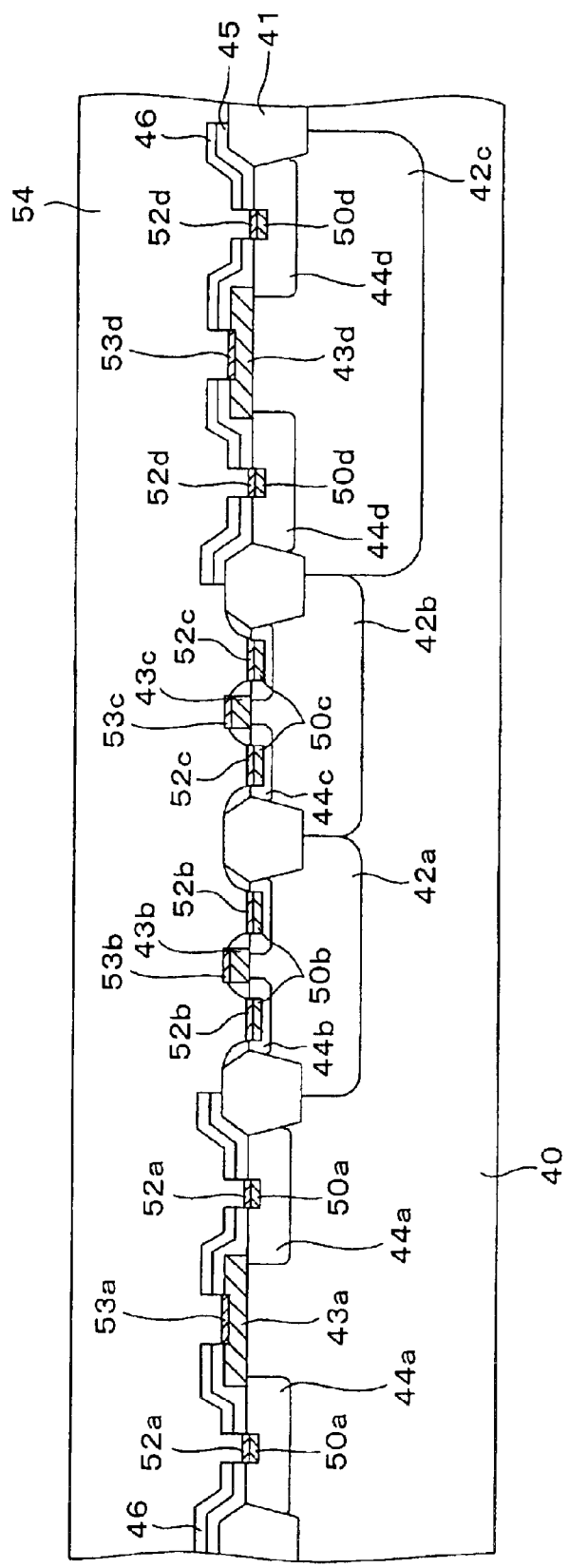

Subsequently, as shown in FIG. 5G, an SiO₂ film is formed over the entire upper surface of the semiconductor substrate 40 as an interlayer insulation film 54.

Figure 5H:
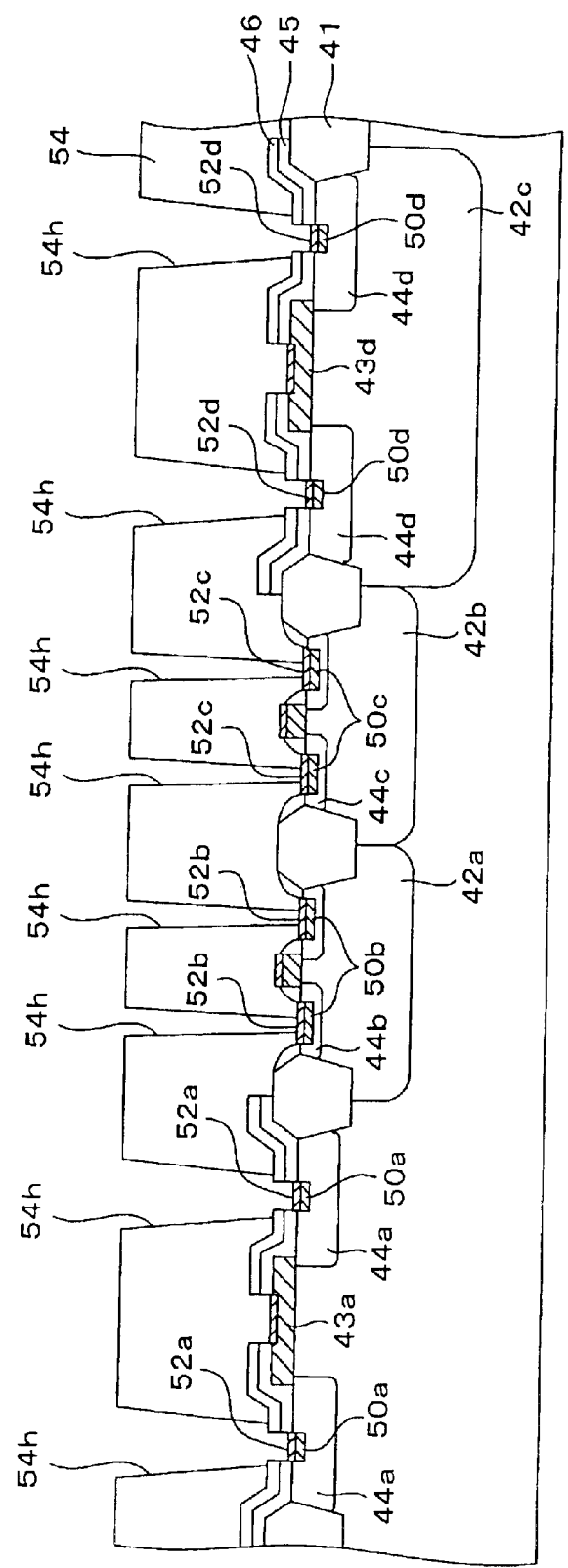

Thereafter, as shown in FIG. 5H, contact holes 54h are formed by photolithography, which reach the silicide films 52a, 52b, 52c and 52d from the upper surface of the interlayer insulation film 54. In this case, in the formation regions of the high voltage transistors, the size of the contact holes 54h are set larger than that of the openings of the SiN film 46 as the silicide block by the margin size for mask alignment. Therefore, the end tip positions of the contact holes are self-aligningly set to positions of the respective openings of the SiN film 46. Each of the contact holes 54h in the formation regions of the high voltage transistors is, for example as shown in FIGS. 7A to 7D, slit-shaped or shaped as rectangles arranged along the gate electrode 43a (or the gate electrode 43d).

Figure 5I:
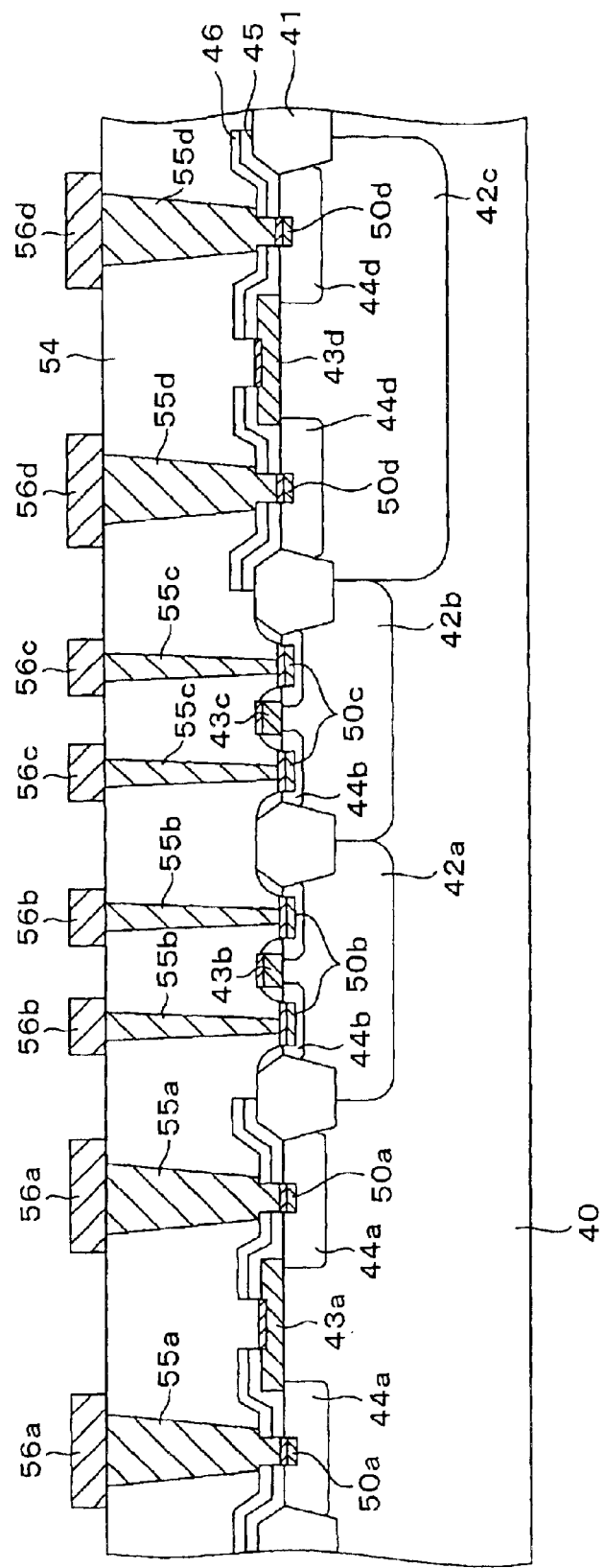

As shown in FIG. 5I, the contact holes 54h are filled with metal such as tungsten to form contact plugs 55a, 55b, 55c and 55d, respectively. A metallic film, for example, including a Ti layer, a TiN layer, an Al layer and a TiN layer, which are laminated in this order, is then formed on the interlayer insulation film 54. The metallic film is then patterned by photolithography to form wiring. Specified wiring lines 56a, 56b, 56c and 56d in the wiring are electrically connected to the source/drain layers 50a, 50b, 50c and 50d via the contact plugs 55a, 55b, 55c and 55d.

As described above, the manufacturing method for a semiconductor device of this embodiment can be applied to the manufacturing method for a semiconductor device including low voltage transistors and high voltage transistors mixedly mounted. Also in this case, the distance between the source/drain layer and the gate electrode of each high voltage transistor can be made smaller, so that an effect of attaining the density improvement of the semiconductor device can be obtained.

Second Embodiment

FIGS. 8A to 8D are sectional views showing the manufacturing method for a semiconductor device of a second embodiment of the present invention in a process order.

Figure 8A:
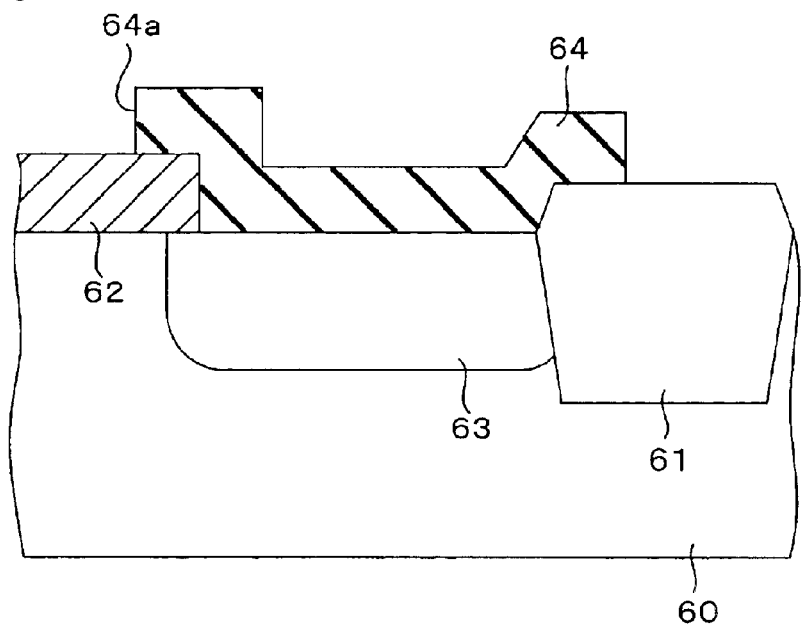
FIGS. 8A to 8D are sectional views showing a manufacturing method for a semiconductor device according to a second embodiment of the present invention.

First, as shown in FIG. 8A, a trench is formed in an element isolation region of a semiconductor substrate 60, and the trench is then filled with an insulating material such as SiO₂ to form an element isolation film 61. Thereafter, a surface of the semiconductor substrate 60 in an element region is oxidized to form a gate insulation film (not shown). On the gate insulation film, a gate electrode 62 is formed of polysilicon in a predetermined pattern.

Subsequently, impurities are ion-implanted at law concentration into the surface of the semiconductor substrate 60 using the gate electrode 62 as a mask to form an LDD layer 63. Over the entire upper surface of the semiconductor substrate 60, an SiN film 64 to be a silicide block is formed, for example, in a thickness of 115 nm. The SiN film 64 is patterned in a predetermined shape by photolithography to form an opening 64a where part of the gate electrode 62 is exposed.

Figure 8B:
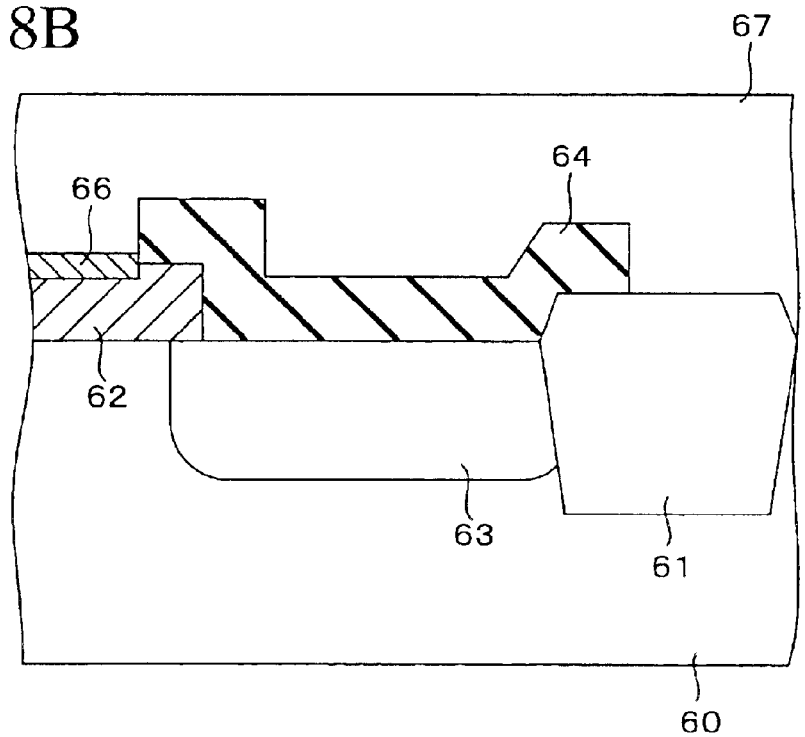

Subsequently, a metallic film such as cobalt or tungsten is formed over the entire upper surface of the semiconductor substrate 60 and then heat-treated. Therefore, as shown in FIG. 8B, a suicide film 66 is formed on the gate electrode 62. Unreacted part of the metallic film is then removed.

Over the entire upper surface of the semiconductor substrate 60, an interlayer insulation film 67 of an insulating material such as SiO₂ is formed, for example, in a thickness of 650 nm. The gate electrode 62, the SiN film 64, and the like are then covered with the interlayer insulation film 67.

Figure 8C:
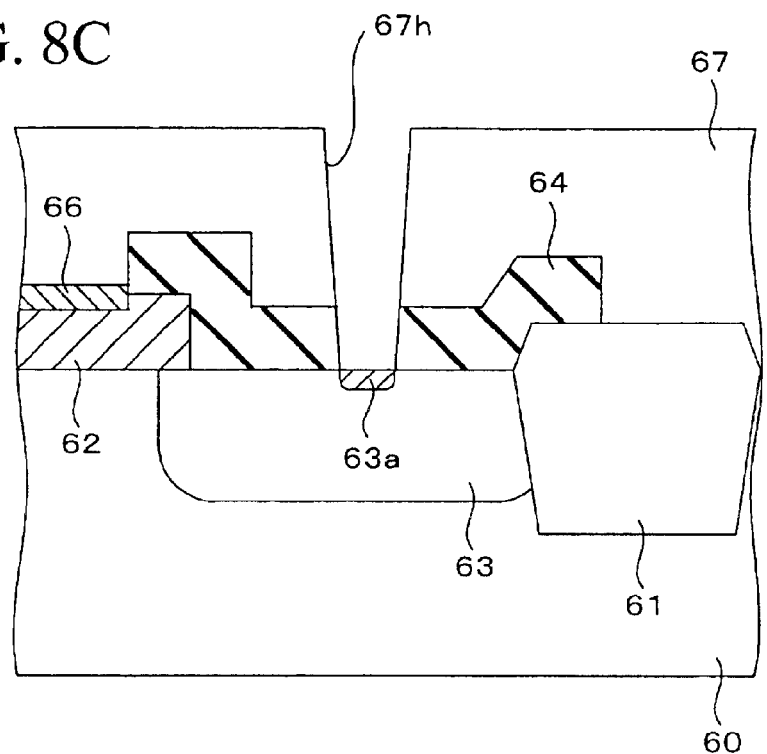
Figure 9:
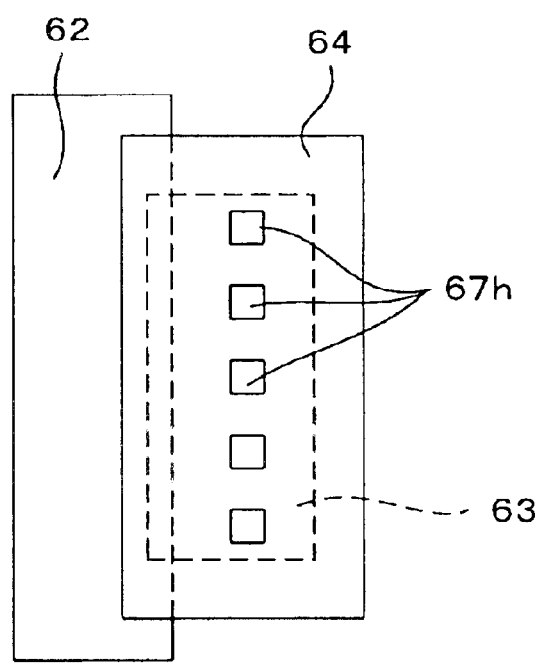
FIG. 9 is a top view schematically showing an example of a shape of contact holes.

Subsequently, as shown in FIG. 8C, a contact hole 67h is formed by photolithography, which reaches the LDD layer 63 from the upper surface of the interlayer insulation film 67. Impurities are then ion-implanted at high concentration into the surface of the LDD layer 63 through the contact hole 67h to form a source/drain layer 63a. In this case, as shown in FIG. 9, each contact hole 67h is shaped as a rectangle, and a plurality of contact holes 67h are formed so as to be arranged along the gate electrode 62.

Figure 8D:
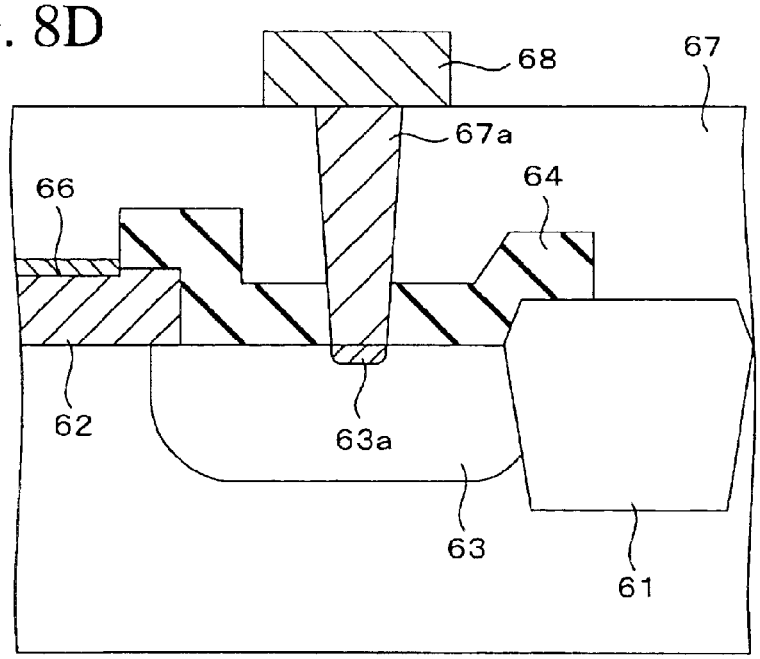

Subsequently, as shown in FIG. 8D, the contact hole 67h is filled with metal such as tungsten to form a contact plug 67a. Specifically, over the entire upper surface of the semiconductor substrate 60, a Ti film, for example with a thickness of 40 nm, and a TiN film, for example with a thickness of 15 nm are sequentially formed, and these Ti film and TiN film cover the wall surface and the bottom surface in the contact hole 67h. Thereafter, tungsten is deposited over the entire upper surface of the semiconductor substrate 60, thereby filling the contact hole 67h with the tungsten and forming a tungsten film on the interlayer insulation film 67. The tungsten film, the Ti film and the TiN film are removed by CMP until the interlayer insulation film 67 is exposed. The contact plug 67a is composed of the tungsten, the Ti film and the TiN film, which remaining in the contact hole 67h.

Thereafter, a metallic film is formed on the interlayer insulation film 67. The metallic film is a laminated film, for example, including a Ti film with a thickness of 20 nm, a TiN film with a thickness of 50 nm, an Al film with a thickness of 500 nm and a TiN film with a thickness of 100 nm, which are laminated in this order. The metallic film is then patterned by photolithography to form wiring. A predetermined wiring line 68 in the wiring is electrically connected to the source/drain layer 63a via the contact plug 67a. The semiconductor device is thus completed.

In this embodiment, after the SiN film 64 and the interlayer insulation film 67 are formed, the contact hole 67h is formed by etching the interlayer insulation film 67 and the SiN film 64. The source/drain layer 63a is formed by introducing the impurities in the LDD layer 63 through the contact hole 67h. Accordingly, the size of the source/drain layer 63a becomes the same as that of the opening in the SiN film 64 as a silicide block. Therefore, the distance between the source/drain layer 63a and the gate electrode 62 can be made smaller than the conventional one, and the density improvement of the semiconductor can be attained.

FIGS. 10A to 10L are sectional views showing a manufacturing method for a semiconductor device including high voltage transistors and low voltage transistors to which the manufacturing method for a semiconductor of the second embodiment of the present invention is applied.

Figure 10A:
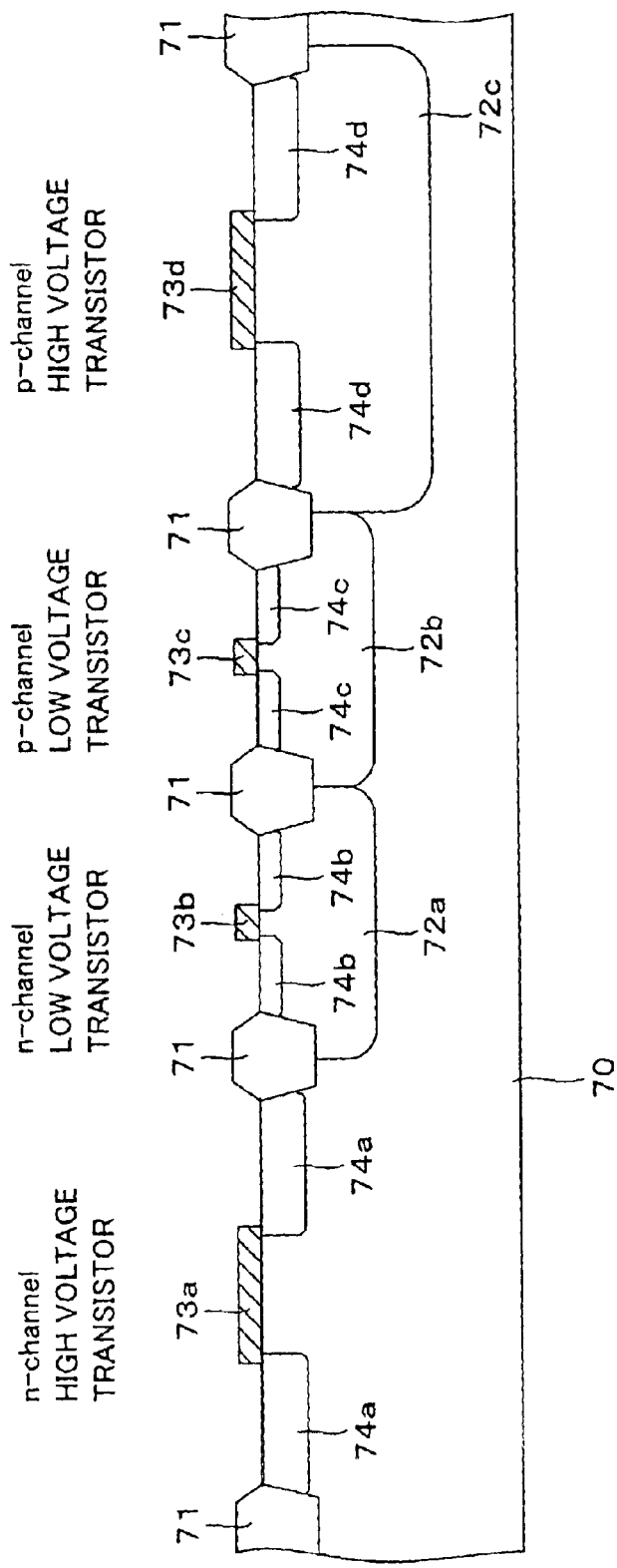

First, as shown in FIG. 10A, trenches are formed in element isolation regions of a p-type silicon semiconductor substrate 70. The trenches are filled with an insulating material such as SiO₂ to form element isolation films 71.

Subsequently, p-type impurities or n-type impurities are selectively introduced into a formation region of an n-channel low voltage transistor, a formation region of a p-channel low voltage transistor and a formation region of a p-channel high voltage transistor to form a p well 72a, an n well 72b and an n well 72c, respectively.

Surfaces of the semiconductor device 70 in element regions are then oxidized to form a gate insulation film (not shown). On the gate insulation film, in a formation region of a n-channel high voltage transistor, the formation region of the n-channel low voltage transistor, the formation region of the p-channel low voltage transistor and the formation region of the p-channel high voltage transistor, gate electrodes 73a, 73b, 73c and 73d are formed of polysilicon in predetermined shapes, respectively.

Subsequently, n-type impurities are introduced into the surface of the semiconductor substrate 70 using the gate electrode 73a as a mask to form LDD layers 74a of the n-channel high voltage transistor. Further, n-type impurities are introduced into the surface of the p well 72a using the gate electrode 73b as a mask to form LDD layers 74b of the n-channel low voltage transistor.

Similarly, p-type impurities are introduced into the surface of the n well 72b using the gate electrode 73c as a mask to form LDD layers 74c of the p-channel low voltage transistor. Further, p-type impurities are introduced into the surface of the n well 72c using the gate electrode 73d as a mask to form LDD layers 74d of the p-channel high voltage transistor.

Figure 10B:
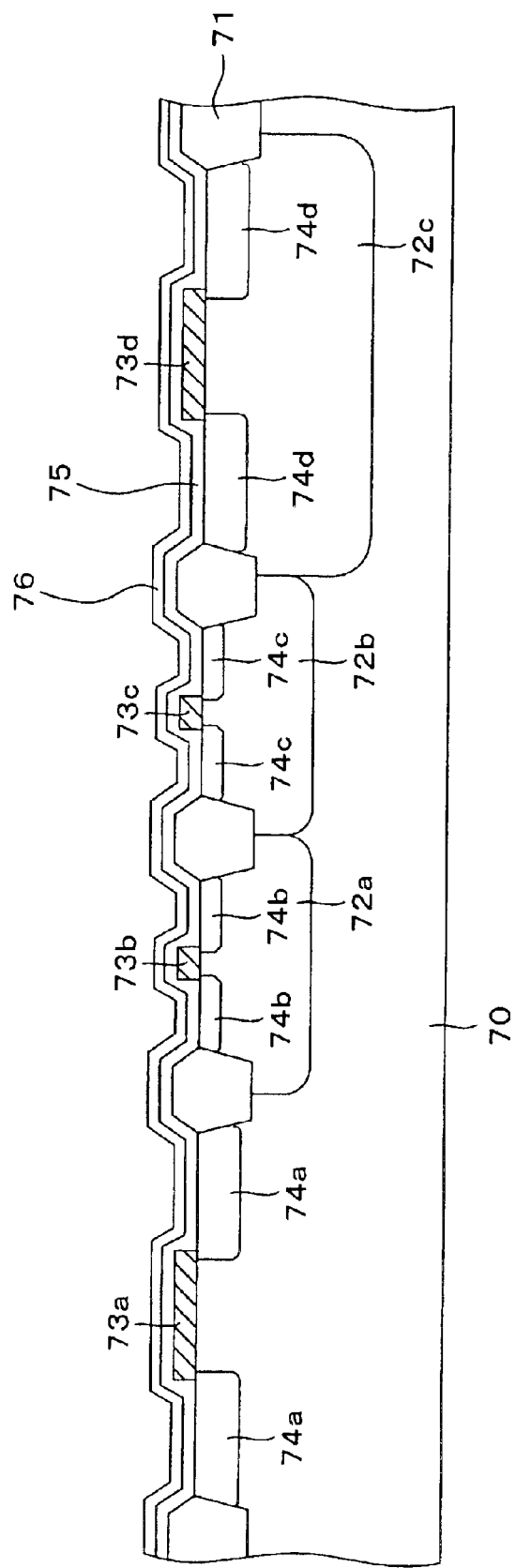

As shown in FIG. 10B, over the entire upper surface of the semiconductor substrate 70, an SiO$_2$ film 75 is formed, and an SiN film 76 to be silicide blocks is further formed thereon.

Figure 10C:
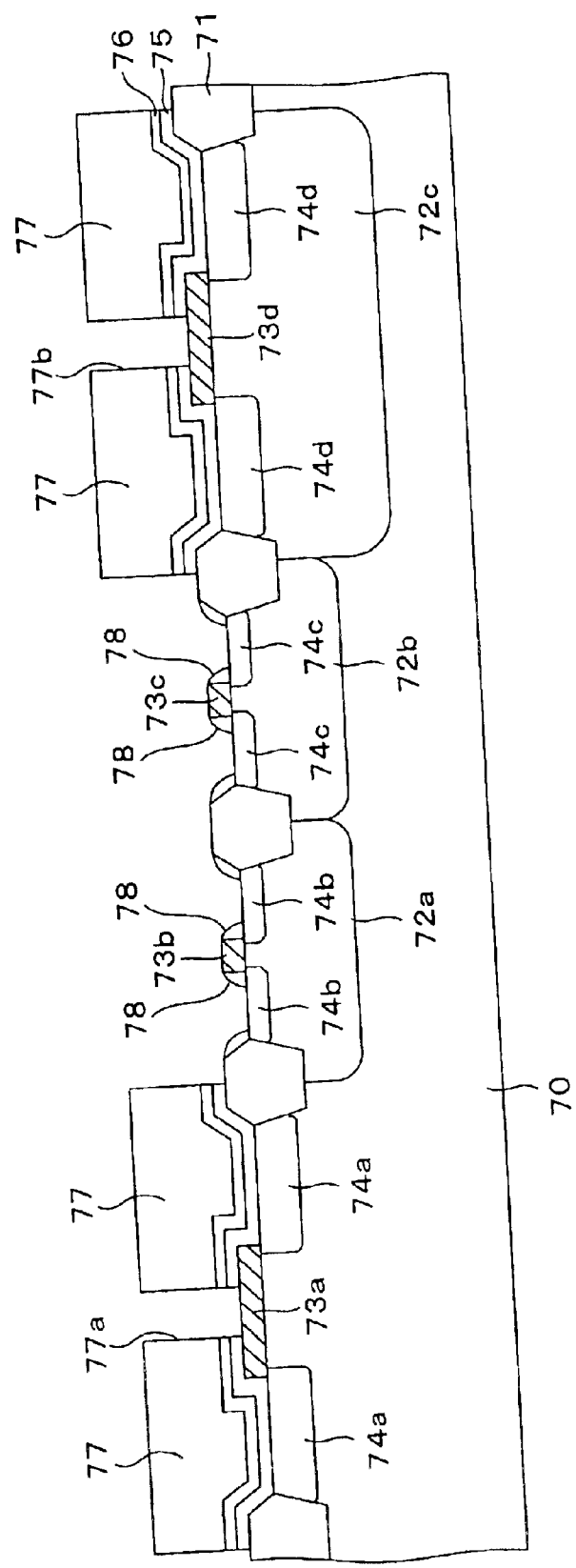

Subsequently, a photoresist film is formed on the SiN film 76, and exposure and development are performed to form resist films 77 covering regions where the silicide film is not formed as shown in FIG. 10C. The SiN film 76 and the SiO$_2$ film 75 is anisotropically etched using the resist films 77 as masks.

By such anisotropic etching, the gate electrodes 73b and 73c of the low voltage transistors are exposed, and part of the gate electrode 73a of the n-channel high voltage transistor and part of the gate electrode 73d of the p-channel high voltage transistor are exposed through openings 77a and 77b in the resist films 77, respectively. On side portions of each of the gate electrodes 73b and 73c, sidewalls 78 are formed of the SiO$_2$ film 75 and the SiN film 76.

Figure 10D:
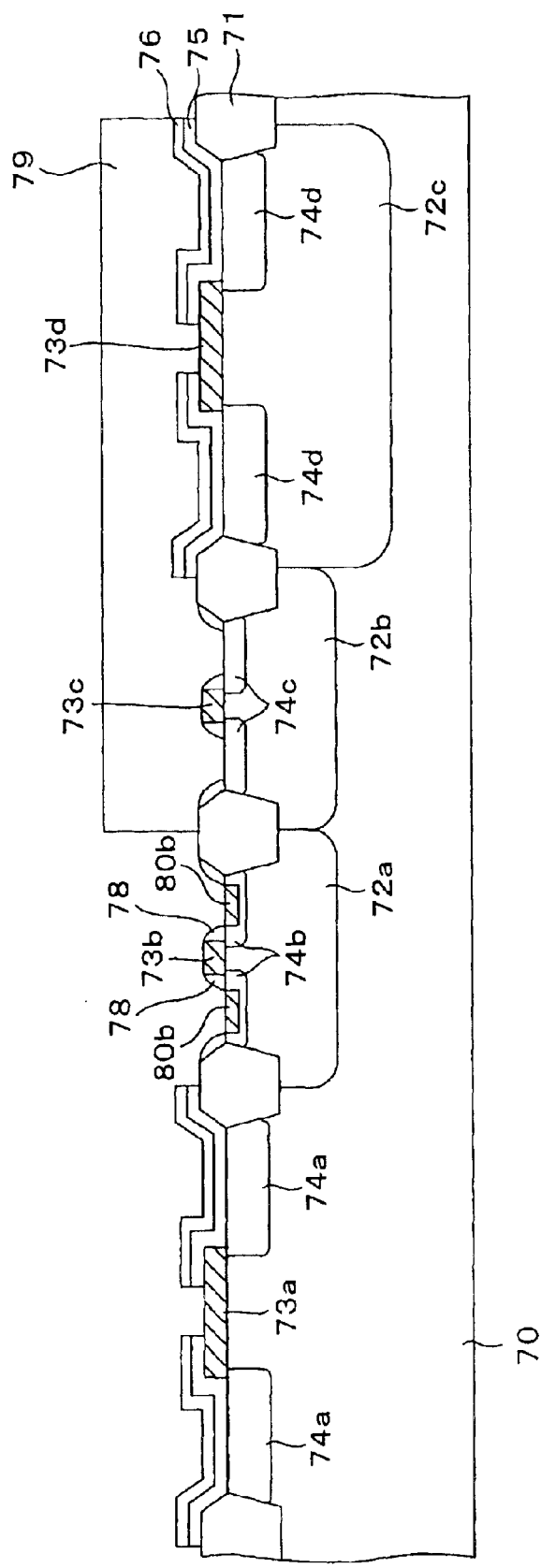

After the resist films 77 are removed, as shown in FIG. 10D, a photoresist film 79 is formed, which covers the formation region of the p-channel low voltage transistor and the formation region of the p-channel high voltage transistor. N-type impurities are then ion-implanted at high concentration into the LDD layers 74b in the formation region of the n-channel low voltage transistor using the SiN film 76 and the sidewalls 78 as masks to form source/drain layers 80b. The resist film 79 is then removed.

Subsequently, as shown in FIG. 10E, a photoresist film 81 is formed, which covers the formation region of the n-channel low voltage transistor and the formation region of the n-channel high voltage transistor. P-type impurities are then ion-implanted into the LDD layers 74c in the formation region of the p-channel low voltage transistor using the SiN film 76 and the sidewalls 78 as masks to form source/drain layers 80c. The resist film 81 is then removed.

Figure 10F:
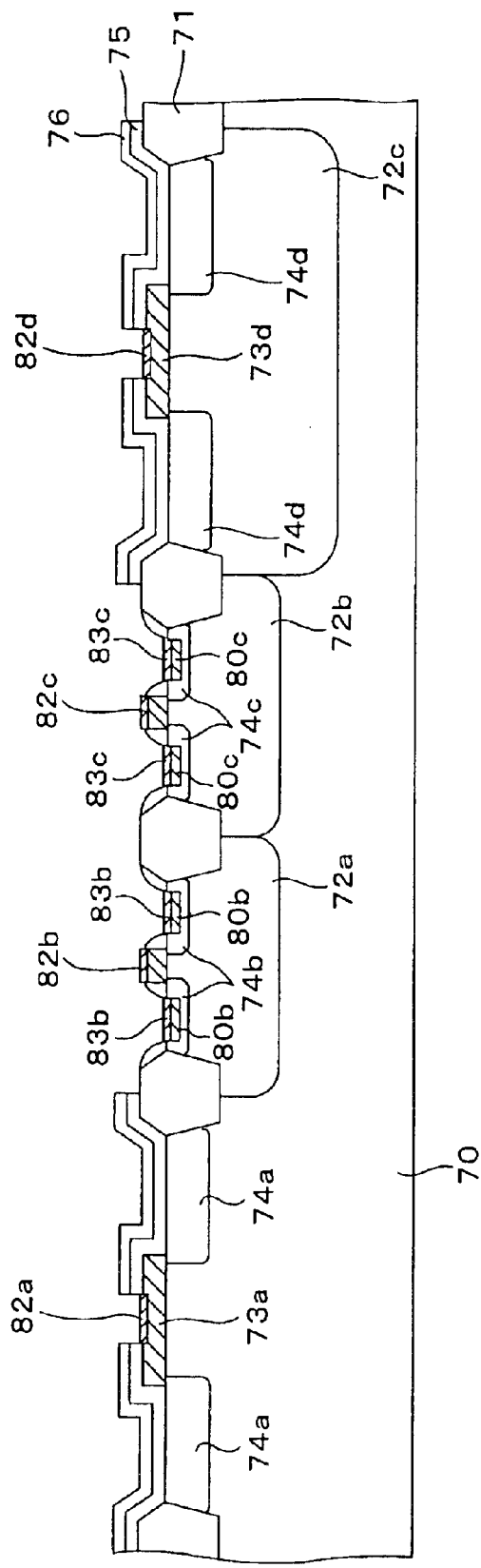

Over the entire upper surface of the semiconductor substrate 70, a metallic film such as cobalt or tungsten is formed and then heat-treated. This causes metal atoms in the metallic film and silicon atoms in the silicon film react with each other in part where the metallic film and the silicon film are in contact with each other to form silicide films 82a, 82b, 82c and 82d on the gate electrodes 73a, 73b, 73c and 73d, respectively, and to form silicide films 83b and 83c on the source/drain layers 80b and 80c, respectively, as shown in FIG. 10F. Unreacted part of the metallic film is then removed by etching.

Figure 10G:
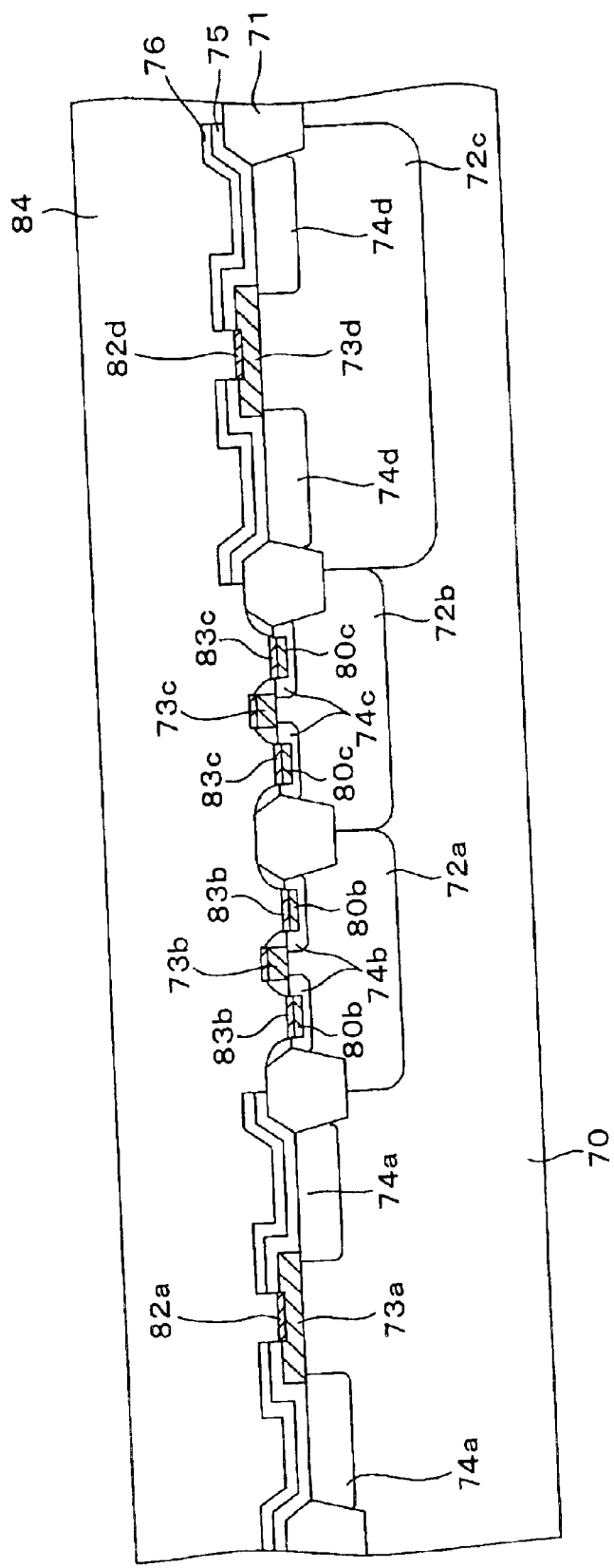

Next, as shown in FIG. 10G, over the entire upper surface of the semiconductor substrate 70, an SiO$_2$ film is formed as an interlayer insulation film 84.

Figure 10H:
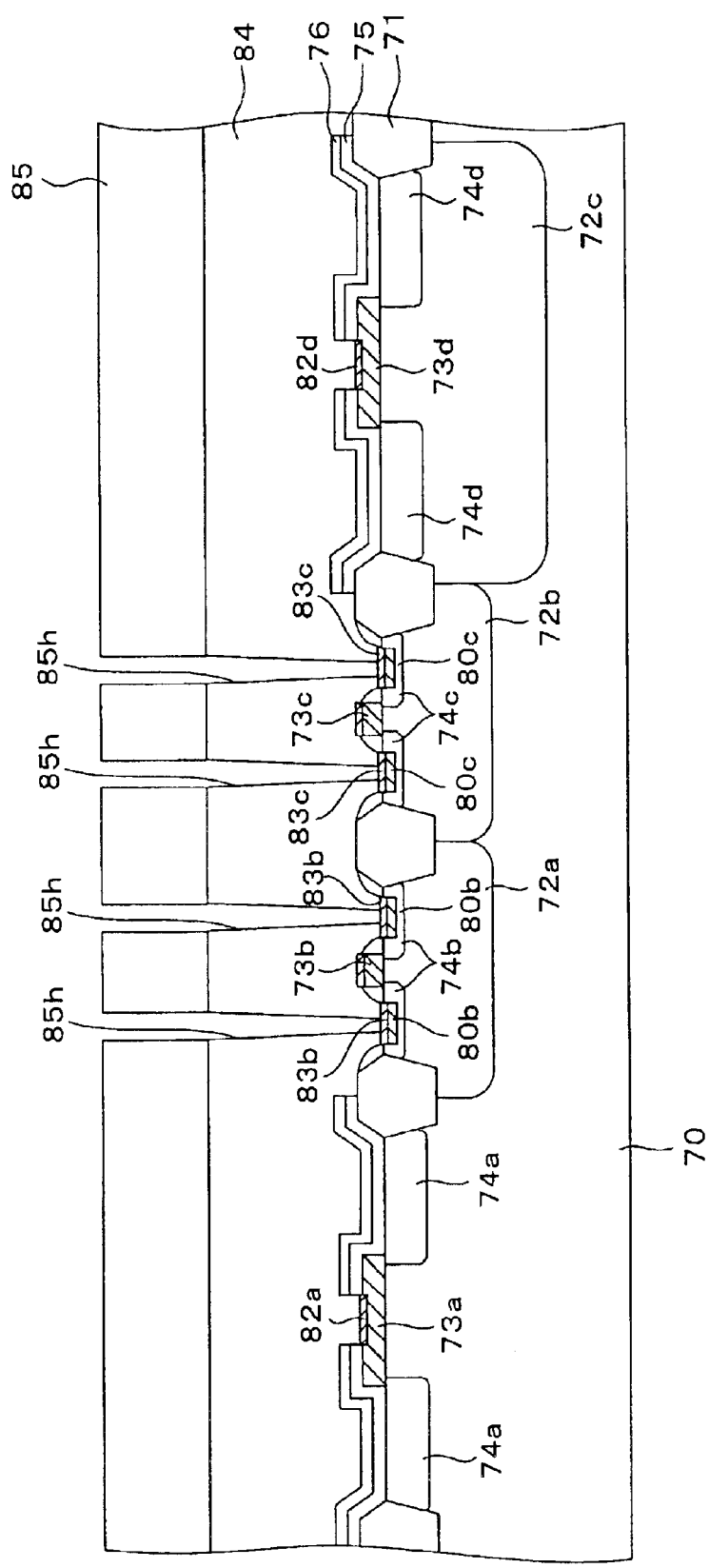

Thereafter, as shown in FIG. 10H, a photo resist film 85 is formed on the interlayer insulation film 84, and exposure and development are performed to provide openings in part corresponding to the silicide films 83b on the source/drain layers 80b of the n-channel low voltage transistor and the silicide films 83c on the source/drain layers 80c of the p-channel low voltage transistor. The interlayer insulation film 84 is anisotropically etched through the openings to form contact holes 85h which reach the silicide films 83b on the formation region of the n-channel low voltage transistor and the silicide films 83c on the formation region of the p-channel low voltage transistor. The resist film 85 is then removed.

Figure 10I:
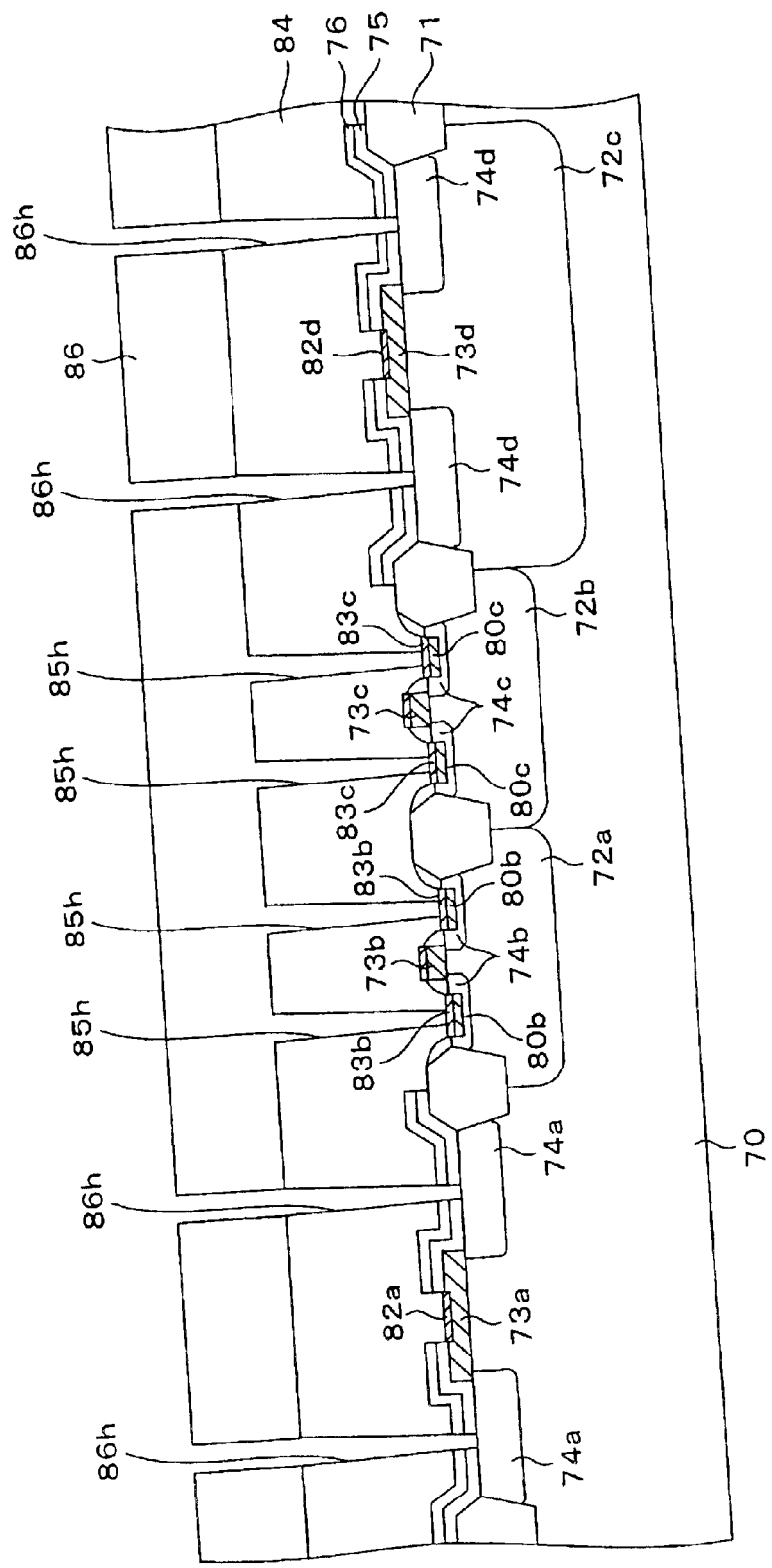

Subsequently, as shown in FIG. 10I, a photoresist film 86 is formed on the interlayer insulation film 84, and exposure and development is performed to provide openings in part corresponding to the LDD layers 74a of the n-channel high voltage transistor and the LDD layers 74d of the p-channel high voltage transistor. The interlayer insulation film 84 is anisotropically etched through the openings to form contact holes 86h which reach the LDD layers 74a of the n-channel high voltage transistor and the LDD layers 74d of the p-channel high voltage transistor. The resist film 86 is then removed.

Figure 11A:
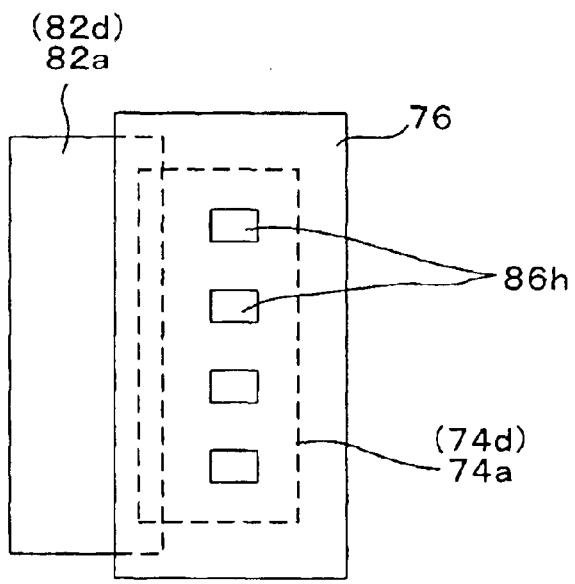
FIGS. 11A to 11B are top views, each showing an example of a shape of each contact hole in the second embodiment.
Figure 11B:
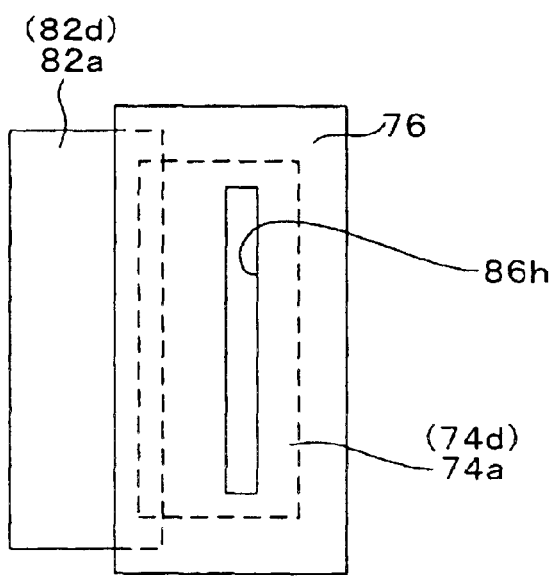

In this process, for example, as shown in FIG. 11A, each contact hole 86h may be shaped as a rectangle, and the contact holes may be arranged along the gate electrode 82a (or the gate electrode 82d). Alternatively, as shown in FIG. 11B, a contact hole 86h may be shaped as a slit extending along the gate electrode 82a (or the gate electrode 82d).

Figure 10J:
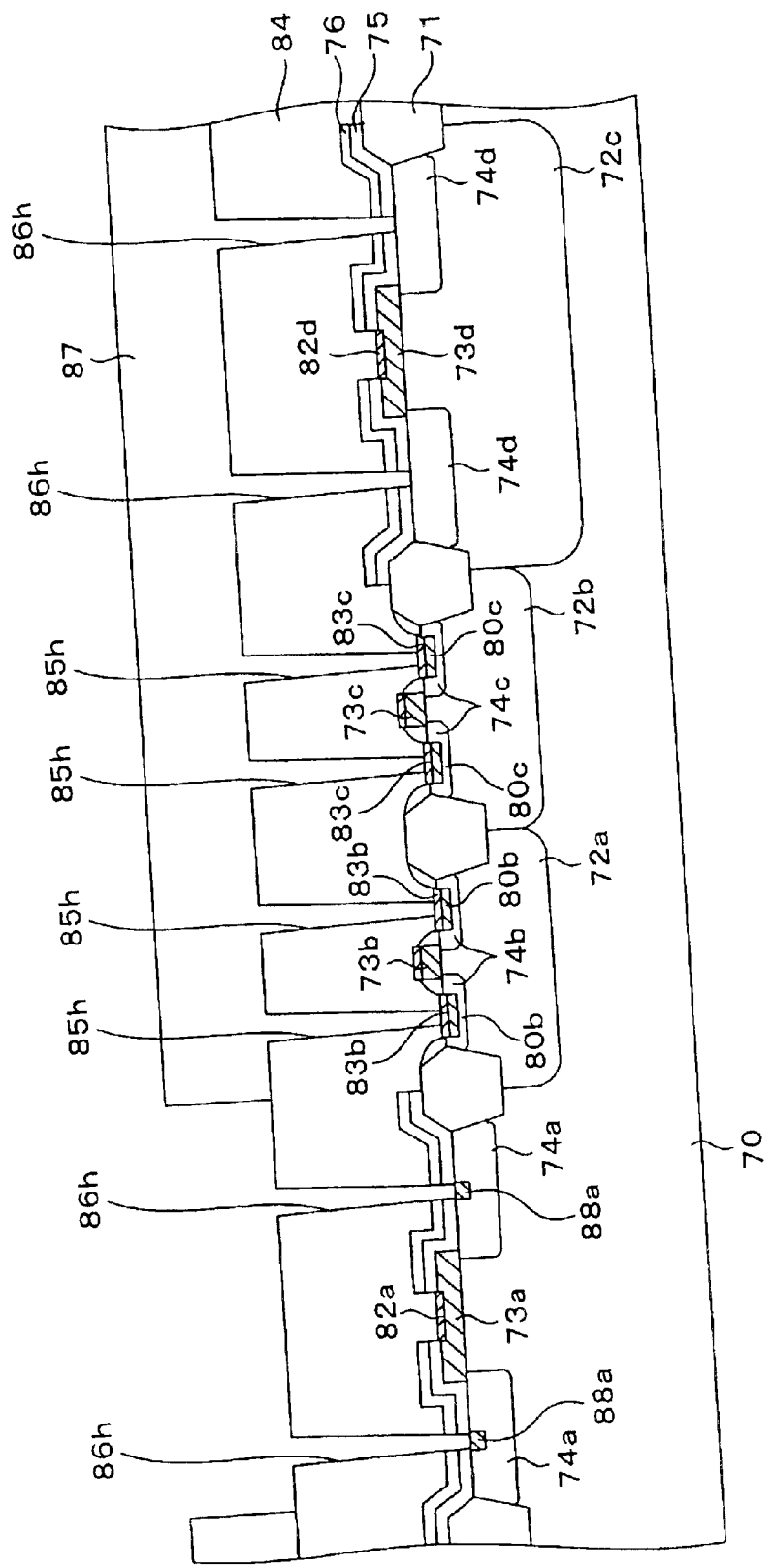

Subsequently, as shown in FIG. 10J, a photoresist film 87 is formed on the interlayer insulation film 84, and exposure and development are performed to provide an opening in part corresponding to the formation region of the n-channel high voltage transistor. N-type impurities are then introduced at high concentration into the LDD layers 74a through the contact holes 86h to form source/drain layers 88a. The resist film 87 is then removed.

Figure 10K:
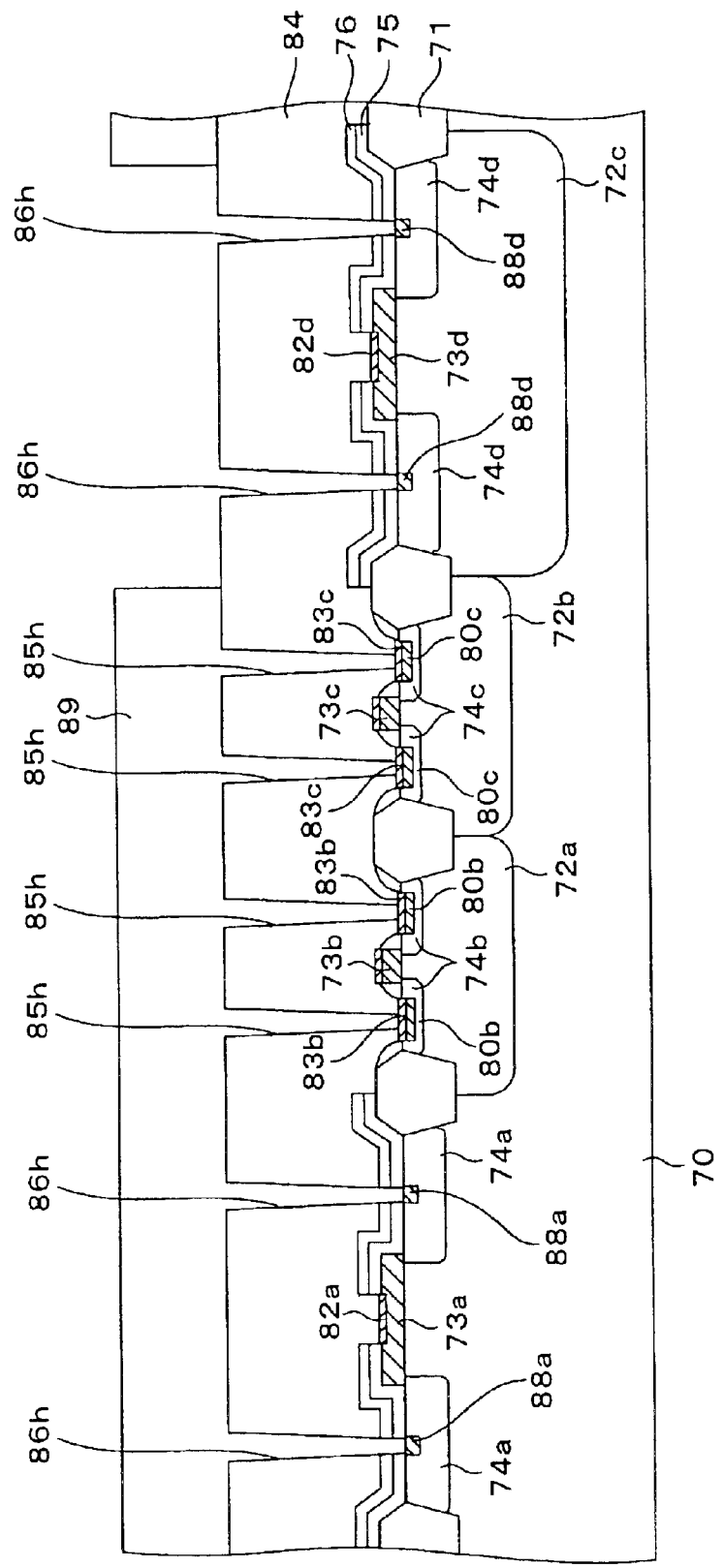

Subsequently, as shown in FIG. 10K, a photoresist film 89 is formed on the interlayer insulation film 84, and exposure and development are performed to provide an opening in part corresponding to the formation region of the p-channel high voltage transistor. P-type impurities are then introduced into the LDD layers 74d at high concentration through the contact holes 86h to form source/drain layers 88d. The resist film 89 is then removed.

Figure 10L:
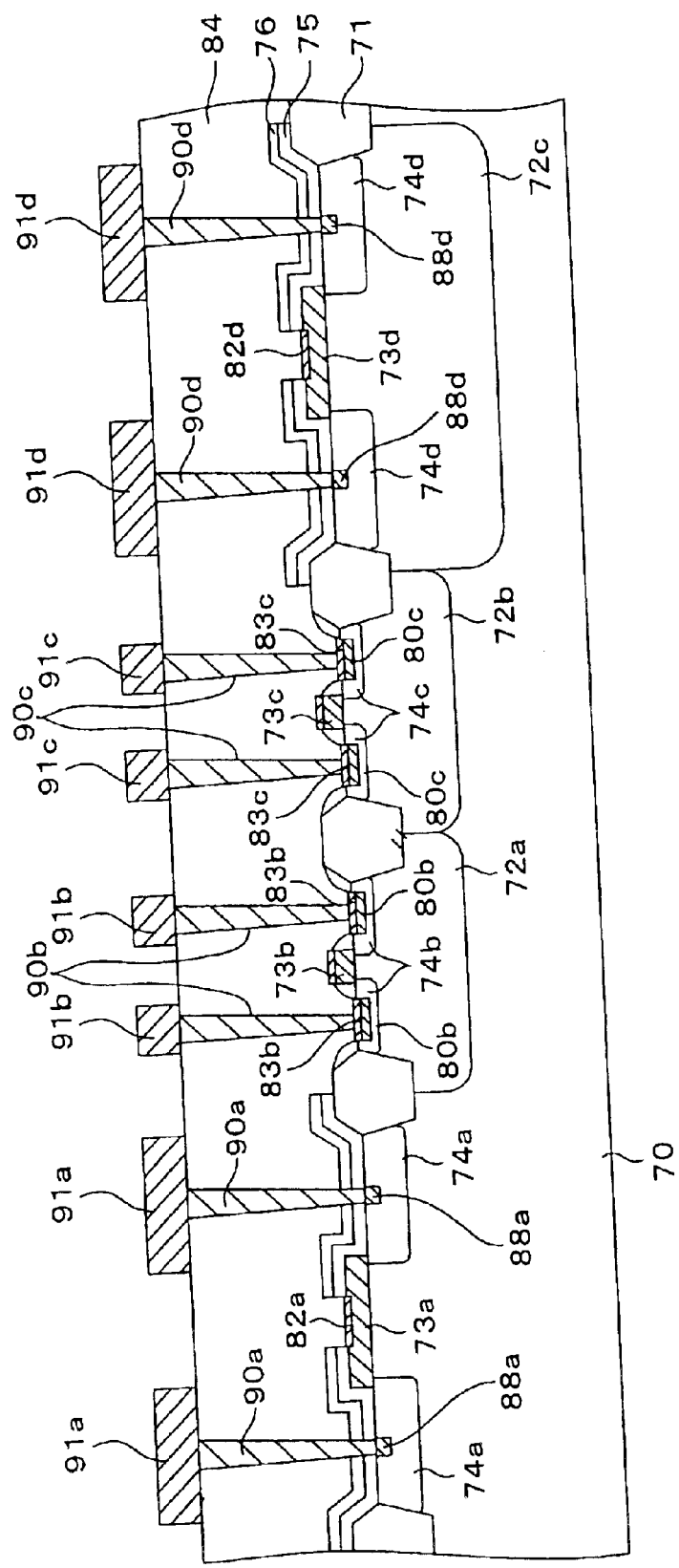

As shown in FIG. 10L, the contact holes 85h and 86h are filled with metal such as tungsten to form contact plugs 90a, 90b, 90c and 90d, respectively. Thereafter, on the interlayer insulation film 84, a metallic film, for example, including a Ti layer, a TiN layer, an Al layer and a TiN layer laminated in this order is formed. The metallic film is patterned by photolithography to form wiring. In the wiring, predetermined wiring lines 91a are individually connected to the source/drain layers 88a of the n-type high voltage transistor via the contact plugs 90a. Wiring lines 91b are individually connected to the source/drain layers 80b of the n-type low voltage transistor via the contact plugs 90b and the silicide film 83b. Wiring lines 91c are individually connected to the source/drain layers 80c of the p-type low voltage transistor via the contact plugs 90c and the silicide film 83c. Wiring lines 91d are individually connected to the source/drain layers 88d of the p-type high voltage transistor via the contact plug 90d.

As described above, the manufacturing method for a semiconductor device of this embodiment can be applied to the manufacturing method for a semiconductor device including low voltage transistors and high voltage transistors mixedly mounted. Also in this case, the distance between each source/drain layer and the gate electrode of the high voltage transistor can be made small, so that an effect of attaining the density improvement of the semiconductor device can be obtained.

What is claimed is:

1. A semiconductor device, comprising:
   a semiconductor substrate;
   a gate electrode formed on the semiconductor substrate;
   a low concentration impurity layer formed by introducing impurities at a low concentration into the semiconductor substrate on each side of the gate electrode;
   a first insulation film formed at least on the low concentration impurity layer;
   an opening provided in the first insulation film to expose part of the low concentration impurity layer;
   a source/drain layer formed by introducing impurities into the low concentration impurity layer at a position aligned with the opening at a concentration higher than that of the low concentration impurity layer;
   a silicide film formed by siliciding a surface of the source/drain layer;
   a second insulation film formed on the semiconductor substrate to cover the gate electrode and the first insulation film;
   a contact hole formed in a width larger than that of the opening at a position aligned with the opening in the first insulation film, the contact hole reaching the source/drain layer from an upper surface of the second insulation film via the opening;
   a contact plug formed by filling the contact hole with electrical conductor; and
   wiring formed on the second insulation film and electrically connected to the silicide film via the contact plug.

2. The semiconductor device according to claim 1, wherein the first insulation film is composed of silicon nitride, and the second insulation film is composed of silicon oxide.

3. A manufacturing method for a semiconductor device, comprising the steps of:
   forming a gate electrode on a semiconductor substrate;
   forming a low concentration impurity layer by introducing impurities into the semiconductor substrate at a low concentration using the gate electrode as a mask;
   forming a first insulation film on the semiconductor substrate and the gate electrode, and forming an opening exposing part of the low concentration impurity layer by patterning of the first insulation film;
   forming a source/drain layer by introducing impurities into the low concentration impurity layer through the opening at a concentration higher than that of the low concentration impurity layer;
   forming a silicide film by siliciding a surface of the source/drain layer inside the opening;
   forming a second insulation film over an entire upper surface of the semiconductor substrate;
   forming a contact hole exposing the silicide film by etching the second insulation film in a width larger than that of the opening of the first insulation film;
   forming a contact plug by filling the contact hole with electrical conductor; and
   forming wiring on the second insulation film, the wiring being electrically connected to the silicide film via the contact plug.

4. The manufacturing method for a semiconductor device according to claim 3, wherein the first insulation film is formed of silicon nitride, and the second insulation film is formed of silicon oxide.

5. The manufacturing method for a semiconductor device according to claim 3, wherein, in the formation of the contact hole, the second insulation film is etched under a condition of high etching selectivity of the first insulation film and the second insulation film.

6. The manufacturing method for a semiconductor device according to claim 3, wherein a distance between the opening and the gate electrode is set in accordance with a withstanding voltage required for a transistor.

7. A semiconductor device, comprising:
   a semiconductor substrate;
   a gate electrode formed on the semiconductor substrate;
   a low concentration impurity layer formed by introducing impurities at a low concentration into the semiconductor substrate on each side of the gate electrode;
   a first insulation film formed on the low concentration impurity layer and the gate electrode;
   an opening provided in the first insulation film, the opening exposing part of the gate electrode;
   a silicide film formed by siliciding a surface of the gate electrode inside the opening;
   a second insulation film formed on the semiconductor substrate to cover the gate electrode and the first insulation film;
   a contact hole reaching the low concentration impurity layer from a upper surface of the second insulation film;
   a source/drain layer formed by introducing impurities into the low concentration impurity layer at a position aligned with the contact hole at a concentration higher than that of the low concentration impurity layer;
   a contact plug formed by filling the contact hole with an electrical conductor; and
   wiring formed on the second insulation film and electrically connected to the source/drain layer via the contact plug.

8. The semiconductor device according to claim 7, wherein the first insulation film is composed of silicon nitride, and the second insulation film is composed of silicon oxide.

9. A manufacturing method for a semiconductor device, comprising the steps of:
   forming a gate electrode on a semiconductor substrate;
   forming a low concentration impurity layer by introducing impurities at a low concentration into the semiconductor substrate using the gate electrode as a mask;
   forming a first insulation film over an entire upper surface of the semiconductor substrate, and then forming an opening exposing part of the gate electrode by patterning the first insulation film;
   forming a silicide film by siliciding a surface of the gate electrode inside the opening;
   forming a second insulation film over an entire upper surface of the semiconductor substrate;
   forming a contact hole reaching the low concentration impurity layer from a upper surface of the second insulation film;

forming a source/drain layer by introducing impurities into the low concentration impurity layer through the contact hole at a concentration higher than that of the low concentration impurity layer;

forming a contact plug by filling the contact hole with an electrical conductor; and forming wiring on the second insulation film, the wiring being electrically connected to the source/drain layer via the contact plug.

10. The manufacturing method for a semiconductor device according to claim 9, wherein the first insulation film is formed of silicon nitride, and the second insulation film is formed of silicon oxide.

11. The manufacturing method for a semiconductor device according to claim 9, wherein a distance between the contact hole and the gate electrode is set in accordance with a withstanding voltage required for a transistor.

12. A manufacturing method for a semiconductor device including a high voltage transistor and a low voltage transistor, comprising the steps of:

forming a first gate electrode in a formation region of the high voltage transistor of a semiconductor substrate, and forming a second gate electrode in a formation region of the low voltage transistor thereof;

forming a first low concentration impurity layer by introducing impurities at a low concentration into the semiconductor substrate using the first gate electrode as a mask, and forming a second low concentration impurity layer by introducing impurities at a low concentration into the semiconductor substrate using the second gate electrode as a mask;

forming a first insulation film over an entire upper surface of the semiconductor substrate;

forming a resist film on the first insulating layer, the resist film having an opening exposing a whole of the formation region of the low voltage transistor and part of the first insulation film on the first low concentration impurity layer;

forming an opening in the first insulation film and a sidewall on each side of the second gate electrode by anisotropically etching the first insulation film, the opening communicating with the first low concentration impurity layer;

removing the resist film;

forming a first source/drain layer and a second source/drain layer in the first low concentration impurity layer and the second low concentration impurity layer, respectively, by introducing impurities into the first and second low concentration impurity layers at concentrations higher than those of the first and second low concentration impurity layers using the first insulation film and the sidewall as masks;

forming a first silicide film by siliciding a surface of the first source/drain layer, and forming a second silicide film by siliciding a surface of the second source/drain layer;

forming a second insulation film over the entire upper surface of the semiconductor substrate;

forming a first contact hole reaching the first silicide film from a upper surface of the second insulation film through the opening of the first insulation film, and forming a second contact hole reaching the second silicide film from a upper surface of the second insulation film;

forming contact plugs by filling the first and second contact holes with electrical conductors; and forming wiring on the second insulation film, the wiring being connected to the contact plugs.

13. A manufacturing method for a semiconductor device including a high voltage transistor and a low voltage transistor, comprising the steps of:

forming a first gate electrode in a formation region of the high voltage transistor of a semiconductor substrate, and forming a second gate electrode in a formation region of the low voltage transistor thereof;

forming a first low concentration impurity layer by introducing impurities at a low concentration into the semiconductor substrate using the first gate electrode as a mask, and forming a second low concentration impurity layer by introducing impurities at a low concentration into the semiconductor substrate using the second gate electrode as a mask;

forming a first insulation film over an entire upper surface of the semiconductor substrate;

forming a resist film on the semiconductor substrate, the resist film having openings exposing a whole of the formation region of the low voltage transistor and part of the first insulation film on the first gate electrode;

forming an opening on the first insulation film and a sidewall on each side of the second gate electrode by anisotropically etching the first insulation film, the opening reaching the first gate electrode;

removing the resist film;

forming a first source/drain layer by introducing impurities into the second low concentration impurity layer at a concentration higher than that of the second low concentration impurity layer using the sidewall as a mask;

forming a first silicide film by siliciding a surface of the first source/drain layer, and forming a second silicide film by siliciding a surface of the first gate electrode;

forming a second insulation film over the entire upper surface of the semiconductor substrate;

forming a first contact hole reaching the first silicide film from a upper surface of the second insulation film;

forming a second contact hole reaching the first low concentration impurity layer from the upper surface of the second insulation film;

forming a second source/drain layer by introducing impurities into the first low concentration impurity layer through the second contact hole at a concentration higher than that of the first low concentration impurity layer;

forming contact plugs by filling the first and second contact holes with electrical conductors; and forming wiring on the second insulation film, the wiring being connected to the contact plugs.

* * * * *